United States Patent
Garlepp et al.

(10) Patent No.: US 6,920,622 B1
(45) Date of Patent: Jul. 19, 2005

(54) METHOD AND APPARATUS FOR ADJUSTING THE PHASE OF AN OUTPUT OF A PHASE-LOCKED LOOP

(75) Inventors: Bruno Garlepp, Austin, TX (US); Yunteng Huang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 30 days.

(21) Appl. No.: 10/187,937

(22) Filed: Jul. 2, 2002

Related U.S. Application Data

(60) Provisional application No. 60/360,497, filed on Feb. 28, 2002.

(51) Int. Cl.$^7$ .............................. G06F 17/50; H03D 3/24
(52) U.S. Cl. ........................ 716/6; 716/1; 716/4; 716/5; 375/373; 375/376
(58) Field of Search .............................. 716/1, 4–6, 10, 716/17; 714/111, 11; 713/501, 400; 709/248; 455/234.1; 375/376, 375, 371, 354, 333; 365/63; 358/1.1; 374/132; 345/213; 331/15; 327/295, 291, 277, 244, 159, 152, 147, 119, 116; 369/59.22

(56) References Cited

U.S. PATENT DOCUMENTS

| | | | |
|---|---|---|---|
| 4,885,554 A | * | 12/1989 | Wimmer ....................... 331/25 |
| 5,053,726 A | | 10/1991 | Christopher et al. |
| 5,247,544 A | * | 9/1993 | LaRosa et al. ............... 375/371 |
| 5,463,351 A | * | 10/1995 | Marko et al. ................ 331/1 A |
| 5,534,822 A | | 7/1996 | Taniguchi et al. |
| 5,572,167 A | | 11/1996 | Alder et al. |
| 5,726,607 A | | 3/1998 | Brede et al. |
| 5,821,816 A | | 10/1998 | Patterson |
| 5,828,250 A | * | 10/1998 | Konno ......................... 327/116 |
| 5,852,728 A | * | 12/1998 | Matsuda et al. ............. 713/501 |
| 6,041,090 A | * | 3/2000 | Chen ........................... 375/376 |
| 6,078,514 A | * | 6/2000 | Takemae et al. .............. 365/63 |
| 6,173,432 B1 | * | 1/2001 | Harrison ........................ 716/1 |
| 6,239,627 B1 | * | 5/2001 | Brown et al. ................ 327/116 |
| 6,366,146 B2 | | 4/2002 | Fredriksson |
| 6,392,495 B1 | | 5/2002 | Larsson |
| 6,498,536 B1 | | 12/2002 | Mori |
| 6,622,255 B1 | * | 9/2003 | Kurd et al. .................. 713/503 |
| 6,661,254 B1 | * | 12/2003 | Agrawal et al. .............. 326/41 |
| 6,804,316 B1 | | 10/2004 | Shectman |
| 2002/0144222 A1 | * | 10/2002 | Noseyama ..................... 716/4 |

OTHER PUBLICATIONS

NN9302251, Acychronous data sampling technique utilizing dial gated oscillators with passive delay lines, Feb. 1, 1993, IBM Technical disclosure bulletin, vol. No.: 36, Issue No.:2, Pafes: 251–254.*

"Clocks for the Synchronized Network: Common Generic Criteria", GR–1244–CORE, Issue 1, Jun. 1995, pp. 3–1, 3–2, and 3–9.

* cited by examiner

Primary Examiner—Vuthe Siek
Assistant Examiner—Helen Rossoshek
(74) Attorney, Agent, or Firm—Zagorin O'Brien Graham LLP

(57) ABSTRACT

An integrated circuit receives a request to adjust the phase of an output clock being generated by a phase-locked loop based on an input reference clock. A digital or analog offset value is injected into the phase-locked loop based on a phase adjustment amount contained in the phase adjustment request. Alternatively, a programmable delay is implemented in the PLL feedback path or the reference clock path. The delay is based on the phase adjustment request.

27 Claims, 10 Drawing Sheets

METHOD AND APPARATUS FOR ADJUSTING THE PHASE OF AN OUTPUT OF A PHASE-LOCKED LOOP

CROSS-REFERENCE TO RELATED APPLICATION(S)

This application claims the benefit under 35 U.S.C. § 119(e) of Provisional Application No. 60/360,497, filed Feb. 28, 2002, entitled "METHOD AND APPARATUS FOR ADJUSTING THE PHASE OF AN OUTPUT OF A PHASE-LOCKED LOOP", naming Yunteng Huang and Bruno Garlepp as inventors, which is hereby incorporated by reference.

BACKGROUND

1. Field of the Invention

This invention relates to phase-locked loops, and more particularly to adjusting the phase of a phase-locked loop output.

2. Description of the Related Art

In optical communication systems, line cards compliant with standards such as Synchronous Optical Network (SONET) or Synchronous Digital Hierarchy (SDH) (the European counterpart to SONET), utilize clock generation circuits to generate clocks used in data transmission and reception. In such clock generation circuits, a phase-locked loop (PLL) receives an input reference clock and generates one or more high speed clocks suitable for use in transmitting or receiving data in a SONET(or SDH) based system. According to one aspect of such a communication system, multiple reference clocks may be supplied to a clock generation circuit to provide a variety of capabilities, including redundancy. When the PLL in the clock generation circuit switches from using one input reference clock to using another input reference clock, the amount of phase change allowed as a result of the switch is restricted, since large phase changes in the output clock due to switching input clocks can lead to problems such as transmission errors.

Even with such restrictions on allowed phase changes, such phase changes can accumulate causing a clock at a source of an optical transmission, which may be kilometers away from a destination, to be become sufficiently out of phase with the clock at the destination that adjusting the phase of one of the clocks would be desirable. In addition clocks are subject to long term wander due to such factors as temperature and voltage variations, which can also lead to phase differences between clocks. Thus, the ability to programmably adjust the phase is desirable.

SUMMARY

Accordingly, in one embodiment, the invention provides an integrated circuit such as a clock generation circuit that includes a phase-locked loop (PLL) that generates an output clock. The output clock may be a multiple of a received reference clock. The integrated circuit also includes a port, such as a serial port, that receives phase adjustment requests to adjust a phase of the PLL output clock. A first phase adjustment circuit is coupled to the port and coupled to the phase-locked loop and injects an offset to adjust the phase of the PLL output signal based on the phase adjustment request. In one embodiment the port is a serial port. The phase adjustment circuit may include logic to add or subtract the phase adjustment amount requested in the phase adjustment request from an existing offset. The phase adjustment circuit may set the offset to the phase adjustment amount specified in the phase adjustment request.

In another embodiment, the invention provides a method of adjusting a phase of a clock generated by an integrated circuit. The method includes receiving a phase adjustment request at one or more terminals of the integrated circuit to adjust the phase of the generated clock by a specified amount and adjusting the phase of the generated clock based on the specified amount. The method may further include receiving at least one reference clock and using a phase-locked loop to generate a multiplied version of the reference clock as the generated clock, which may have a lower, higher, or the same frequency as the reference clock. The method may further include injecting an offset based on the specified amount of phase adjustment into the phase-locked loop to adjust the phase of the clock generated by the PLL. The method may adjust the phase by controllably delaying a feedback path signal, or delaying an input reference clock with the amount of delay being determined by the phase adjustment request.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
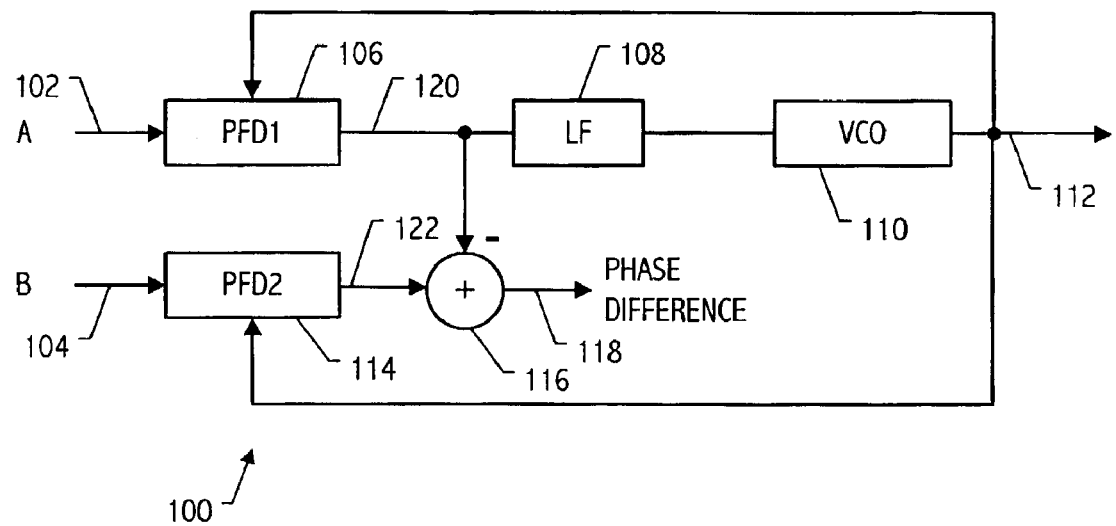
FIG. 1 illustrates conceptually an embodiment of the invention.

Referring to FIG. 1, a phase-locked loop (PLL) 100 receives two input clocks designated as clock A 102 and clock B 104, either of which may be utilized as the input clock by the phase-locked loop 100. Conceptually, the phase difference between the input clocks is monitored and stored. When an event occurs that causes the input clock being utilized by PLL 100 to switch, the known phase difference is utilized to compensate for that difference. As shown in FIG. 1, each clock input is provided with a phase/frequency detector 106 and 114 for monitoring the phase difference at any given time between the respective input clocks A and B and the PLL output 112. Phase/frequency detector 106 monitors the phase difference between the PLL output 112 and the input clock A 102 and phase/frequency detector 114 monitors the phase difference between the output 112 and the input clock B 104. A loop filter 108, and voltage controlled oscillator (VCO) 110 provide the remaining PLL functionality. Differences between the outputs of the phase detectors 120 and 122 are tracked at 116 and the phase difference 118 is stored. As shown in FIG. 1, the PLL 100 is operating utilizing input clock A 102 as an input clock. When PLL 100 switches to clock B 104 as the input clock, the stored phase difference can be utilized to zero out the phase difference between clocks A and B in a manner described further herein.

When it is desired to switch between input clocks, for example switching from input clock A 102 to input clock B 104, the stored phase difference may be utilized to provide a relatively glitch free switch between the two input clocks. More particularly, if the desired input clock were switched to input clock B 104, then the output of the phase/frequency detector 114 may be provided to the loop for processing by the PLL loop filter 108 and the voltage controlled oscillator 110. However, the input to the loop filter 108 that is provided from the phase/frequency detector 114 is adjusted such that the phase difference 118 is accounted for. Thus when a switching event occurs, adjustments are provided for the phase difference between the two input clocks such that glitch free switching between the clocks may occur even if the two input clocks contain a phase difference. In this manner two phase detectors are used continuously to monitor the input clocks to provide a phase adjustment that may be utilized when switching between the input clocks.

FIG. 1 provides a conceptual framework for understanding the hitless switching techniques disclosed herein. A variety of circuits may be utilized to achieve the concept of monitoring and storing the phase difference between the input clocks and adjusting the phase detector outputs of a PLL based upon the stored phase difference in order to achieve the desired glitch free input clock switching.

Figure 2:
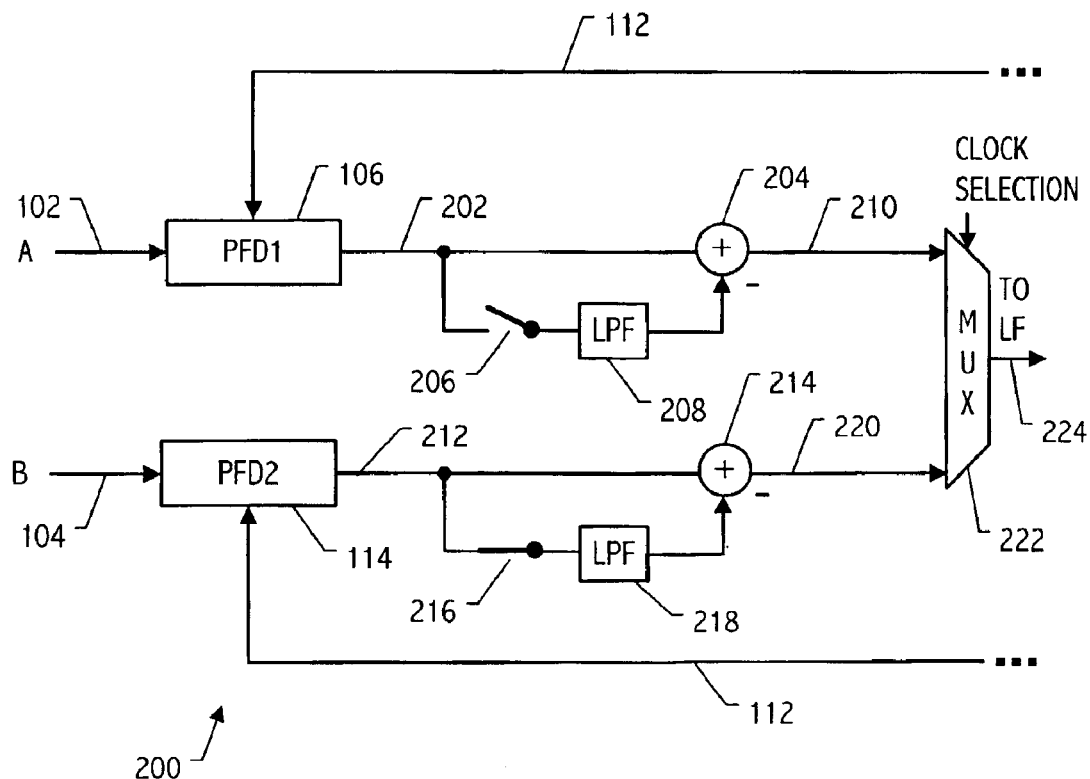
FIG. 2 illustrates one embodiment of the invention including circuitry for phase detection and phase adjustment utilizing a stored phase difference.

FIG. 2 illustrates one embodiment for monitoring, storing and utilizing the phase difference between the input clocks to compensate for phase differences on switching. For clarity of understanding, the circuitry of FIG. 2 is shown with reference to two input clocks. However, it will be recognized that the concepts illustrated therein may be utilized with three or more input clocks. As shown in FIG. 2, input clock A 102 and input clock B 104 are provided. The output 112 of the PLL is fed back to phase/frequency detectors 106 and 114. Potential loop filter inputs on nodes 210 and 220 are provided for transmission to a PLL loop filter (not shown) through a multiplexer 222 which selects one of the inputs for the loop filter. When the selected input clock is input clock A 102, the signal on node 210 is provided to the loop filter as the loop filter input and when the selected input clock is input clock B 104, the signal on node 220 is selected as the loop filter input.

The operation of the phase detection and adjustment circuitry 200 of FIG. 2 will be described with reference to input clock A 102 being the original operating clock and a subsequent switching event switching the operation to input clock B 104. At the beginning of operation, the input clock A 102 and input clock B 104 are provided to phase/frequency detectors 106 and 114 respectively. In one embodiment, the phase/frequency detectors 106 and 114 may each be delta-sigma digital phase/frequency detectors as described herein in more detail below and described in application Ser. No. 09/902,541, filed Jul. 10, 2001, entitled DIGITALLY-SYNTHESIZED LOOP FILTER CIRCUIT PARTICULARLY USEFUL FOR A PHASE LOCKED LOOP, which is incorporated herein by reference. In such an embodiment, the outputs 202 and 212 of the phase/frequency detectors 106 and 114 are one bit digital data streams. When the input clock A 102 is the selected operating clock, the switch 206 will be open. Assuming for the moment that the low pass filter 208 does not have an initial value, the output of the summation block 204 provided as the loop filter input on node 210 will therefore be the value of the output on node 202 of the phase/frequency detector 106.

While input clock A 102 is selected as the operating clock, the switch 216 will be closed. The output 212 of the phase/frequency detector 114 for clock B will therefore be provided to both the summation block 214 and the low pass filter 218. Low pass filter 218 filters and stores the low frequency components of the phase difference signal on node 212 provided from phase/frequency detector 114. The output of the low pass filter 218 is then subtracted from the signal on node 212 at summation block 214 to provide the loop filter input on node 220. The low pass filter 218 stores the last sampled low frequency components of the phase difference, e.g., in a register (not shown) for use as described in more detail below. When the input clock A 102 is the selected operating clock (the PLL input clock), the multiplexer 222 selects the loop filter input on node 210 for further processing and the loop filter input on node 220 is not utilized.

Note that comparing the phase of the input clock B 104 to input clock A 102 can be achieved by comparing the phase of input clock B 104 to the output of the VCO supplied on node 112 since the output of the VCO is locked to the phase of input clock A 102 while A is the selected clock. Additionally, the phases can be compared by comparing the clocks directly, or their difference signals may be compared as shown in FIG. 1.

When it is desired to utilize the input clock B 104 in the PLL operation as the PLL input clock, states of switches 206 and 216 are reversed. Thus, when it is desired to switch to input clock B 104, switch 206 will be closed and switch 216 will be opened. The output node 224 of the multiplexer 222 will receive the signal on node 220. In this mode of operation, inputs to the summation block 214 will be the output 212 of the phase/frequency detector 114 for clock B and the last stored value of the low pass filter 218 created before the switch 216 was opened. Thus the loop filter input on node 220 will be the difference between the continuously changing output 212 and the last stored value of the low pass filter 218. With regard to the clock A path, switch 206 is now closed and the low pass filter 208 will receive the output on node 202 of the phase/frequency detector 106 for clock A. The low pass filter 208 may also store the last filter output in a register as with low pass filter 218. In this mode of operation, inputs to the summation block 204 will be the phase difference on node 202 detected by the phase/frequency detector 106 for clock A and the current output of the low pass filter 208.

Because of the subtraction of the LPF output, the circuitry described above provides a high pass filtering function for the input clock path of the non-selected input clock. When a clock is then selected, the high pass filtering function is disabled and the last output value of the low pass filter is held in a register so that the low frequency (i.e. DC) offset component is then subtracted from the phase/frequency detector output.

If it becomes desirable to switch back to utilizing the input clock A, the above described process may then be reversed again with switch 206 now being opened and switch 216 being closed. In addition, the output of multiplexer 222 will then be switched again based upon a clock selection input. In this manner, the input clock selected for utilization with the PLL system may be repeatedly switched, without propagating phase offset information to the loop filter of the PLL.

The circuitry of FIG. 2 operates to monitor phase difference between the two input clocks and account for this difference when switching between the clocks. When input clock A 102 is the operating clock, the output of the phase/frequency detector 114 is put through a low pass filter, and a DC value that represents the static phase difference between the two input clocks will be obtained. Thus, the output of the low pass filter 218 (which will be stored) is representative of the phase difference between the two input clocks A and B and this stored information may then be used when the selected clock is switched to clock B. Likewise, the circuitry works in the same fashion for switching from clock B to clock A. In this manner when a switching event occurs, an offset signal representative of the phase difference is injected into the loop to take into account the phase difference between the two input clocks.

The techniques described above provide a method for monitoring the phase difference between the input clocks. However if the two input clocks have even a slightly different frequency, the phase difference between the two clocks may continuously grow over time. Thus, in one embodiment, the phase detector tracks the phase difference up to a certain amount of phase difference. When the phase difference exceeds that predetermined amount, phase adjustment circuitry adjusts the phase difference by a predetermined amount. That may be accomplished by "swallowing" or"spitting" out a pulse in a feedback path, thus effectively increasing or decreasing the phase difference by a discrete step when the magnitude of the phase difference is above a predetermined amount. The discrete step may be implemented through the use of a modulus divider placed between the VCO output and the phase/frequency detector. Using a discrete step adjustment when the magnitude of the phase difference exceeds a predetermined amount also allows the phase/frequency detector to work in a relatively small region of its linear range.

Figure 3:
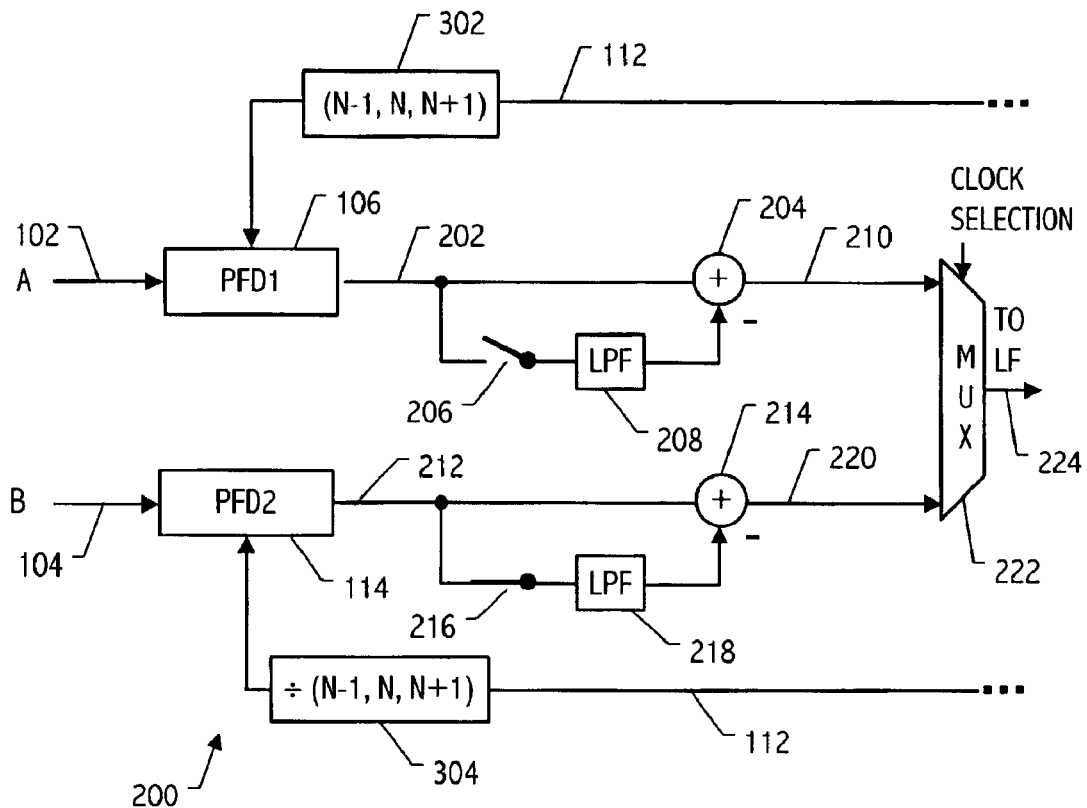
FIG. 3 illustrates the addition of a divider to the circuitry of FIG. 2 to provide a discrete phase adjustment functionality by pulse swallowing or spitting.

FIG. 3 illustrates the addition of a divider to the circuitry of FIG. 2 to implement the pulse swallowing or spitting functionality. As shown in FIG. 3, dividers 302 and 304 are added to divide the VCO output 112 by a variable amount. In normal operation, the dividers 302 and 304 may operate as a divide by N (where, e.g., N=16) divider. However, if the phase difference becomes too positive or negative, the divisor may be temporarily changed to a divide by N−1 or divide by N+1 function respectively. In that fashion a pulse may be spit or swallowed, thus effectively increasing or decreasing, by a fixed amount, the phase difference stored by the system.

Figure 4:
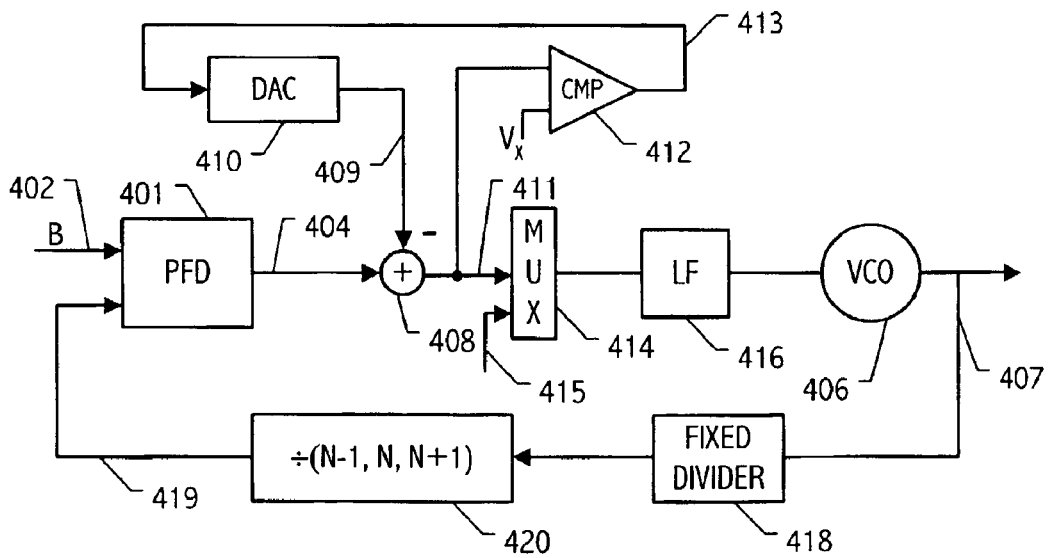
FIG. 4 illustrates aspects of an embodiment for detecting, storing, and injecting a stored phase difference into a phase-locked loop in order to achieve low phase transient response when switching PLL input clocks.

Referring to FIG. 4, an embodiment of one of the clock paths of the PLL is illustrated. Phase frequency detector 401 receives the B clock input 402. In the embodiment illustrated in FIG. 4, assume that the A clock (not shown) is the clock selected as the operating PLL clock. Phase/frequency detector 401 generates a phase difference signal 404 that indicates the phase difference between the feedback clock 419 and the B clock 402. The phase difference signal 404 is summed in summer 408 with a DC offset signal 409 supplied from digital to analog converter (DAC) 410, generating the sum signal 411. When B is selected as the PLL clock, the DC offset signal 409 is subtracted from the phase difference signal 404 to ensure that switching to B clock 402 as the PLL input clock is accomplished in a glitch free manner.

While B is the non-selected clock, comparator 412 compares the sum signal 411 with a voltage Vx. In a Type II PLL, the phase difference signal supplied to loop filter 416 is driven to 0 volts (and thus Vx=0). Thus, any deviation from 0 volts indicates the difference between B clock 402 and the feedback clock 419. Multiplexer 414 receives the phase difference signal representing the phase difference between the B clock 402 and the feedback clock 419. Multiplexer 414 also receives the phase difference signal 415 indicating the phase difference between the A clock (not shown) and a feedback clock (not shown). The output of the multiplexer 414 is supplied to the loop filter 416, which in turn controls VCO 406.

The comparator 412 compares the phase difference signal supplied on node 404 (summed with any DC offset from DAC 410) with Vx (Vx=0) and supplies a signal on node 413 to DAC 410. A register (not shown) associated with comparator 412 or DAC 410 stores the difference between the offset adjusted phase difference signal 411 and Vx. The embodiment shown in FIG. 4 also includes a fixed divider circuit 418 and a variable divider circuit 420. Note that the fixed divider circuit 418 may not be used in certain embodiments. In one embodiment, the fixed divider circuit can be more easily implemented to accommodate higher frequencies than the variable divider circuit, and its use allows the variable divider circuit to operate at lower frequencies. The use of the fixed divider circuit, however, results in coarser resolution in the variable divider circuit.

Figure 5:
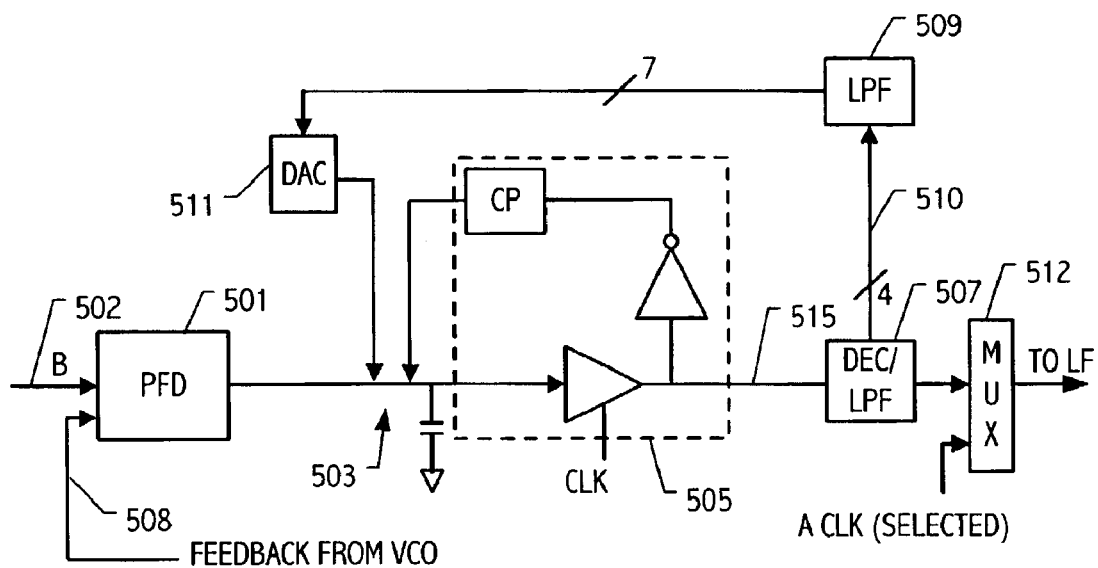
FIG. 5 illustrates another embodiment of a portion of the embodiment illustrated in FIG. 4.

Referring to FIG. 5, another embodiment of a portion of a PLL according to the present invention is illustrated. In FIG. 5, the output from the phase/frequency detector 501, which may be implemented, e.g., as a tri-state or XOR based phase detector, is summed with the output from DAC 511 at summing node 503. The analog output of summing node 503 is coupled to a sigma delta analog to digital converter (ADC) 505, which outputs a stream of 1's and 0's indicative of the phase difference between B clock 502 and the feedback on node 508 supplied from the VCO (not shown in FIG. 5) including the offset from DAC 511. The output from ADC 505 is supplied to a decimator/low pass filter circuit 507. Such a circuit, may be implemented in the manner as shown in FIG. 6.

Figure 6:
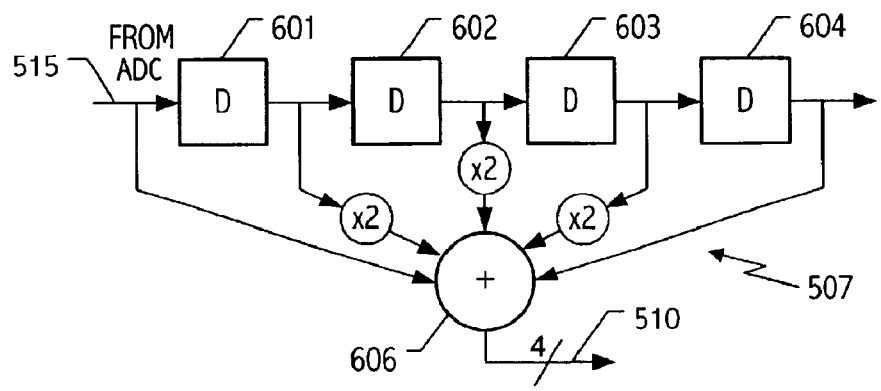
FIG. 6 illustrates an exemplary decimator/filter circuit which is utilized in an embodiment of the present invention.

As shown in FIG. 6, a serial bit stream is supplied to flip-flops 601–604 from the output 515 of ADC 505. The outputs from the flip-flops, along with the input bit supplied on node 515 are supplied to summer 606, which in turn supplies a four bit sum on node 510. A multiply by two operation is performed on the outputs of flip-flops 601, 602, and 603 before they are provided to summer 606. The decimator reduces the clock by a factor of four allowing subsequent stages to run more slowly and therefore consume less power.

The four bit output 510 from circuit 507 is supplied to low pass filter 509 and sent to the multiplexer. The additional low pass filter 509 may be used to lower the corner frequency to more effectively track out slowly moving phase changes. The low pass filter may be implemented as an 11 bit counter, which counts for 256 cycles and then uses the upper seven bits of the result to increment or decrement a digital to analog converter (DAC) 511, which in turn supplies the offset to summing node 503. As long as the B clock is non-selected, any phase difference between the B clock 502 and the output of the VCO (not shown) supplied on node 508 is tracked out. When the B clock becomes the selected clock for the phase-locked loop, the last value representing the phase difference between the B clock 502 and the VCO output is frozen as an offset to the phase difference signal generated by phase/frequency detector 501. That offset value is used as long as the B clock is the selected input to the phase-locked loop. The stored value of the phase difference utilized to provide the offset no longer updates until the B clock once again becomes the non-selected clock. In another embodiment, the phase difference (offset) may be stored and supplied to summing node 503 only when switching clocks.

Thus, in one implementation, output of the low pass filter 509, which can be a positive or negative number, is added to the existing DAC value periodically, (e.g., every 256 cycles). In one embodiment, the offset provided by the DAC is always injected into node 503, whether or not clock B is selected.

In another embodiment, the offset to node 503 is not applied until clock B becomes selected. In that case, the output of LPF 509 represents the phase difference between the feedback signal and the B clock and becomes the DAC value.

Figure 7:
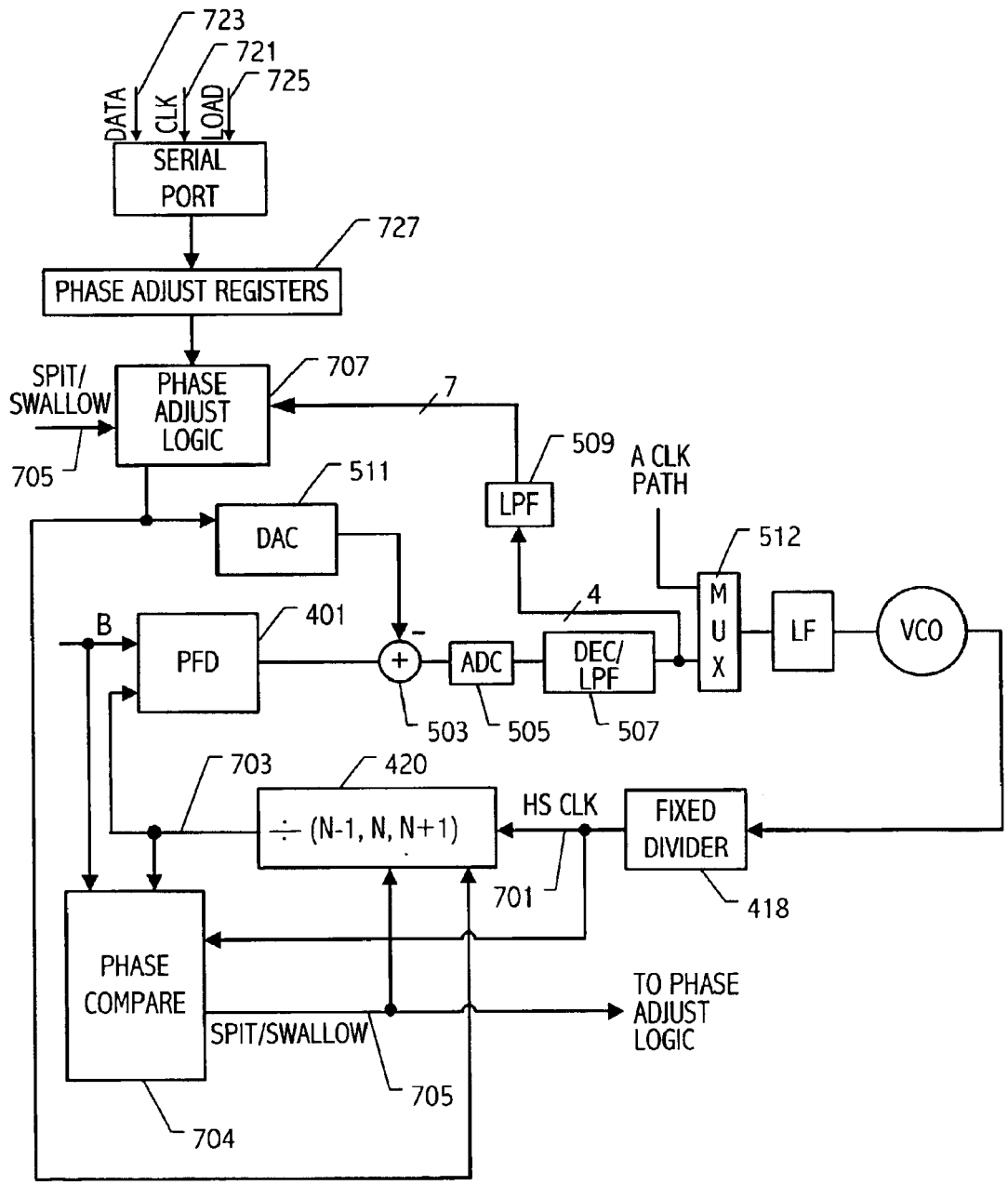
FIG. 7 illustrates additional details regarding coarse phase adjustment.

Referring to FIG. 7, a more detailed embodiment is illustrated of logic associated with the use of the variable divide blocks introduced in FIG. 3. Assume the high speed clock (HS CLK) 701 is normally N times the frequency of the feedback clock signal supplied on node 703 from the variable divider block 420. The phase compare logic block 704 compares the phase of B clock 502 with the feedback signal on node 703 to determine if those signals have become out of phase by more than a predetermined amount.

In the embodiment illustrated in FIG. 7, that phase compare logic determines if the clocks are out of phase by more than the period of the high speed clock. When the high speed clock is 16 times the normal frequency of the compared signals, that equates to being out of phase by more than 22.5 degrees. If the magnitude of the difference is greater than 22.5 degrees, then the phase compare logic asserts spit/swallow control signal 705, which may be implemented as multiple signal lines, to cause the variable divider block to either spit or swallow a clock pulse according to whether the B clock input is leading or lagging the feedback signal on node 703 by more than 22.5 degrees. That is, the divider block 420 provides the clock signal on node 703 one high speed clock cycle early or one high speed clock cycle late, thus permanently changing the phase relationship between the feedback signal and the input reference clock. In one embodiment, N=16 for the variable divider circuit 420.

A "swallow" occurs when a pulse is swallowed, i.e., a divide by N+1, and a "spit" occurs on a divide by N−1. The DAC 511 also receives the spit/swallow control signal 705 through phase adjust logic 707. That spit/swallow signal causes the seven bits supplied to the DAC to be incremented/decremented by the appropriate offset amount to reflect the phase change due to the spit or swallow. In that way, when a spit/swallow event takes place, the DAC 511 can immediately cause the offset to be adjusted by that amount. Note that the adjustment of the DAC resulting from a spit/swallow tends to cause the DAC to move back towards its centered value, which reflects the elimination or reduction of the phase difference between the non-selected reference clock and the feedback from the PLL. A spit/swallow event equates to a phase change, (in this embodiment) of ±22.5 degrees. In one embodiment, the DAC receives a 7 bit input with a value of 64 (1000000) representing 0° offset, 32 (0100000)=−22.5° and 96 (1100000)=+22.5°. Adjusting by +/−22.5 degrees provides a coarse adjustment capability that results in a fixed phase adjustment in response to a phase difference above a predetermined amount (e.g. 22.5 degrees). Utilizing such coarse phase adjustments allows the PFD 401 to operate in a 45 degree range of phase difference (±22.5 degrees), which is well within a linear range of the phase detector.

The fine grain phase adjustments take place using the tracking loop, which includes the LPF 509, phase adjust logic 707, and DAC 511 in the embodiment shown in FIG. 7, and the coarse adjustments operate using the phase compare logic 704 and variable divider block 420 in the embodiment shown in FIG. 7.

Figure 8:
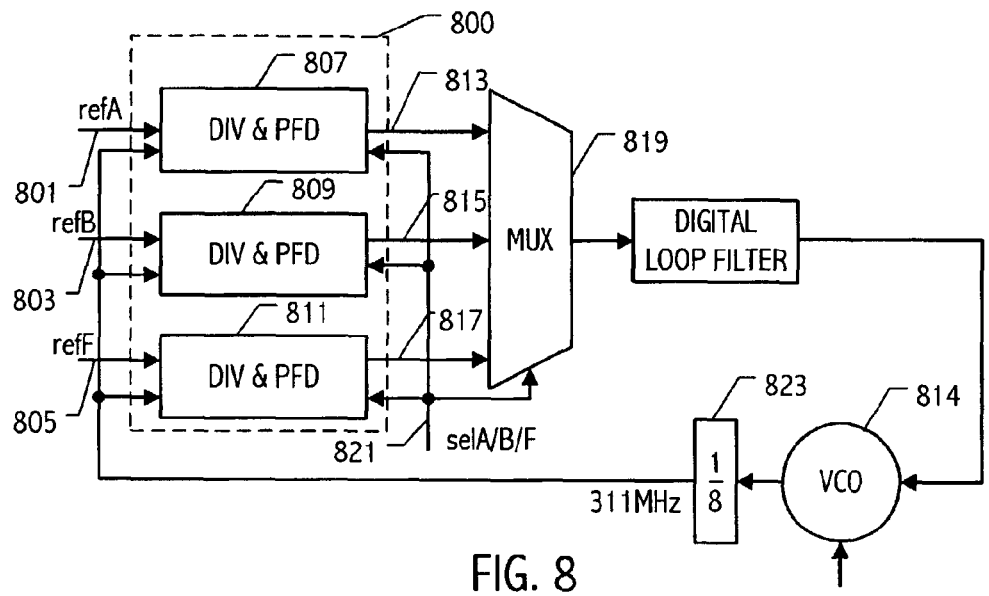
FIG. 8 illustrates another embodiment of the invention.

A high level block diagram of an embodiment is illustrated in FIG. 8, in which three clocks A, B, and F, are supplied on nodes 801, 803, and 805, respectively. Each of those circuit blocks 807, 809, and 811 have the logic uniquely associated with each clock path in the phase-locked loop, which includes the variable divider block, the phase and frequency detector, and the circuits used to measure and store the phase difference between the received clock (A, B, or F) and the feedback signal from the output of the VCO 814. The signals provided on nodes 813, 815 and 817 to multiplexer 819 represent the phase difference (along with any injected DC offset) obtained as described, e.g., in FIG. 5. The multiplexer control supplied on control line 821 is also supplied to the logic blocks 807, 809 and 811 so the logic blocks can know when to freeze the stored phase difference as an offset into the phase-locked loop without further updating of the offset.

Figure 9:
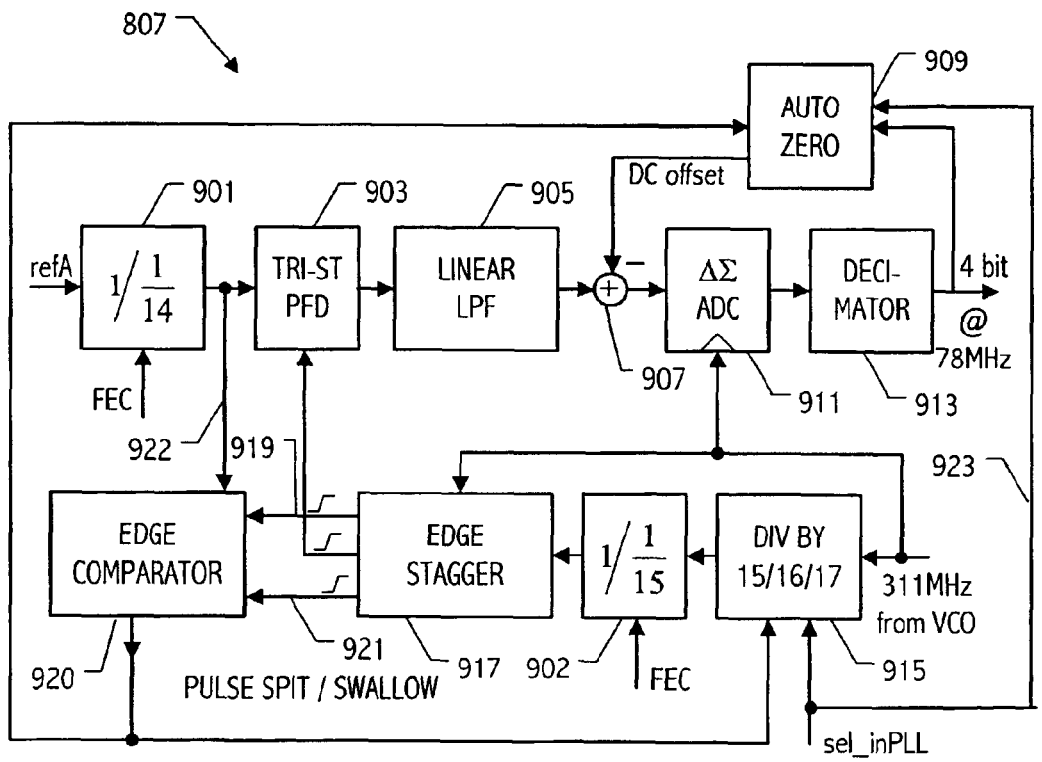
FIG. 9 illustrates additional details of the divider and phase/frequency detector (PFD) circuit of FIG. 8.

FIG. 9 illustrates an exemplary embodiment of one of the circuits block 807, 809, and 811. The forward error correction (FEC) 15/14 rate conversion blocks 901 and 902 are known in the art and not necessary for understanding the invention. Accordingly, they will not be discussed further herein. In the embodiment illustrated in FIG. 9, the phase and frequency detector (PFD) 903 is implemented as a tri-state phase and frequency detector. A low pass filter 905 is provided to smooth the output from PFD 903. The summing block 907 allows the phase difference to be injected into the phase-locked loop as a DC offset value from AUTOZERO block 909. AUTOZERO block 909 functions to keep the non-selected clock, combined with any required DC offset, locked to the output of the PLL so that switching between reference clocks may occur without undue phase jitter. In one embodiment the AUTOZERO block 909 may be implemented as LPF 509 and DAC 511, as shown in FIG. 5. The analog to digital converter 911 converts the analog phase difference signal summed with the DC offset to a digital value that is provided to the decimator 913, which in turn provides its output both to the multiplexer 819 (see FIG. 8) and the AUTOZERO block 909. Decimnator 913 may be implemented as decimator 507 shown in FIG. 6. The signal line sel_inPLL 923 conveys a signal that freezes the offset circuitry when this clock is selected to drive the PLL.

The feedback path in FIG. 9 includes a variable divider block 915, where N=16, which provides the coarse phase adjust by spitting or swallowing a pulse. The edge stagger block 917 creates three clock edges staggered by one period of the 311 MHz clock from the VCO (VCO output divided by eight). The edge comparator block 920 receives the leading and lagging clock edges 919 and 921 along with the clock 922 supplied to PFD 903. The edge comparator logic determines whether there is a need to spit or swallow a pulse if the edge of clock 922 is not within the window created by the leading and lagging edges 919 and 921. The spit/swallow logic will send out a spit/swallow control signal appropriate to the location of the edge of clock 922 with respect to the leading and lagging edges of clocks 919 and 921. As in the previous embodiments, a spit/swallow control signal is also supplied to the AUTOZERO block 909 to ensure that the discrete phase change is reflected in the DC offset provided to summing node 907.

Figure 10A:
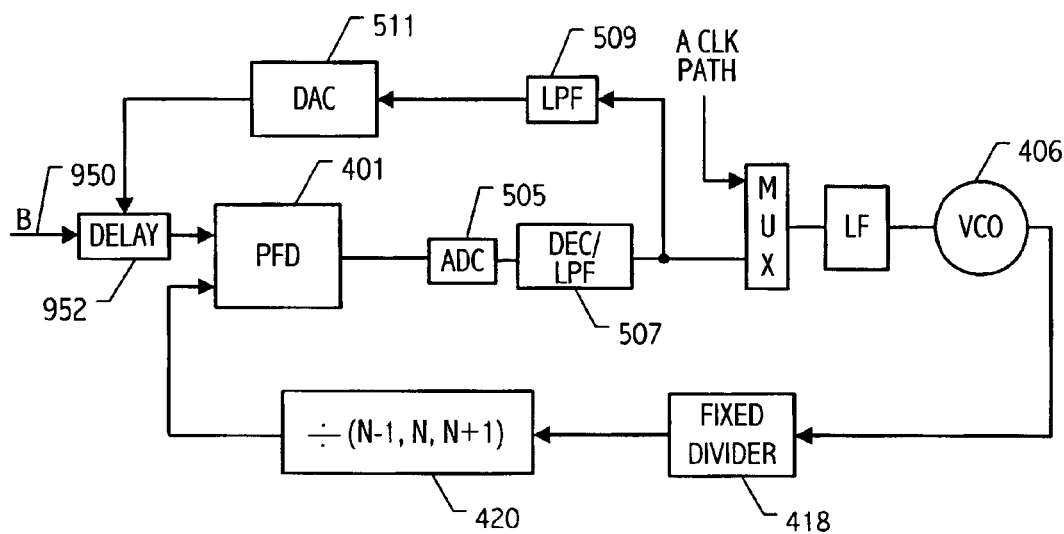
FIG. 10A illustrates an embodiment utilizing a controllable delay block in the path of the reference clock.
Figure 11:
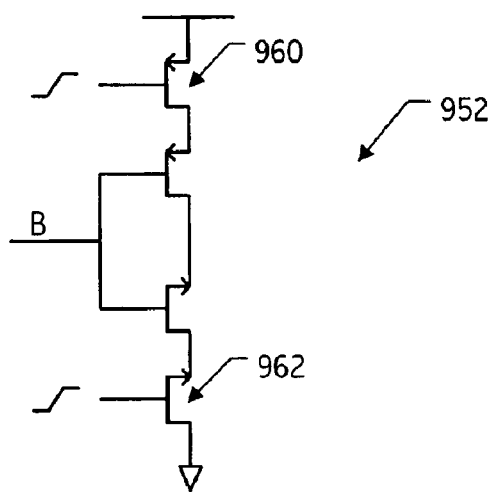
FIG. 11 illustrates additional details of an embodiment of a delay block utilized in FIG. 10.

Another embodiment of the invention is illustrated in FIG. 10A. In the embodiment illustrated in FIG. 10A, the stored phase difference is injected into the PLL by adjusting a delay path of B clock 950. DAC 511 converts the stored phase difference to an analog signal, which is used to control the delay of B clock 950 through delay block 952. An exemplary delay block is illustrated in FIG. 11, where the B clock is supplied to an inverter, with the path through the inverter being controlled by the voltage supplied to the gates of transistors 960 and 962. A delay block may be formed by one or more stages of the circuitry shown in FIG. 11. Further, while FIG. 11 illustrates an exemplary delay block (or portion thereof) for a single-ended logic, in a differential implementation (not illustrated in FIG. 11), the tail currents of the differential circuit could be controlled according to the stored phase difference. Further, while an analog signal could be used to adjust the delay of the delay block, digital control could also be implemented by providing multiple transistors which are controlled according to a digital value indicative of the stored phase difference, in place of analog controlled gates. That would obviate the need for the DAC.

Figure 10B:
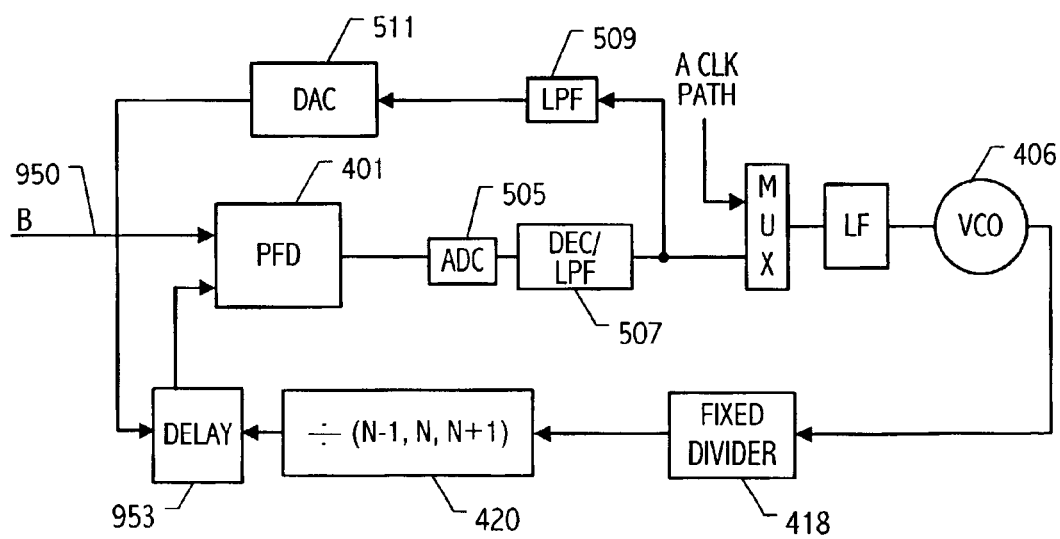
FIG. 10B illustrates an embodiment utilizing a controllable delay block in the feedback path.

The delay could also be implemented by placing a delay block 953 in the feedback path between the VCO 406 and the PFD 401 as shown in FIG. 10B. The delay block may be constructed and controlled as described with relation to delay block 952. That is, the stored phase difference is used to adjust a delay path of the feedback path from the VCO 406. DAC 511 converts the stored phase difference to an analog signal, which is used to control the delay of the feedback signal being supplied from divider block 420. The delay block may be implemented as described with relation to FIG. 11.

Figure 10C:
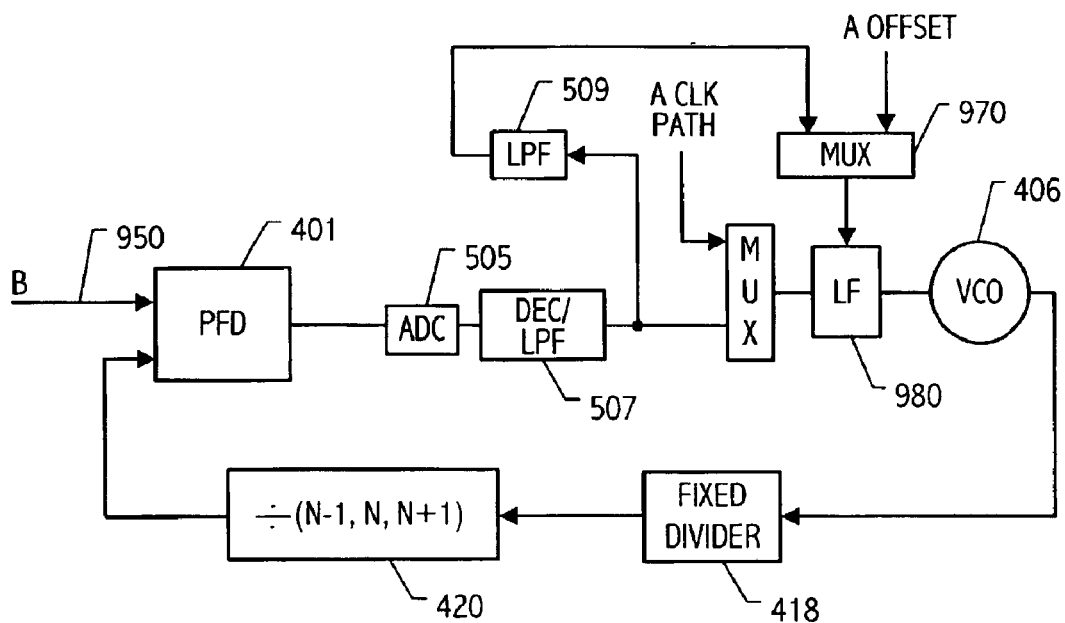
FIG. 10C illustrates an embodiment in which the offset is injected into the loop filter.

In another embodiment, illustrated in FIG. 10C, the phase difference is injected into the loop filter 980 of the PLL. In one embodiment that is accomplished by providing the digital output from the low pass filter 509 to a multiplexer 970 which also receives an offset from the other clock(s) (e.g., the A clock). The digital output is a DC offset that is subtracted from a value in the loop filter that is being generated to control VCO 406. Multiplexer 970 selects the DC offset from the selected clock. Note that while a digital value may be provided, analog signals may also be used to represent the DC offset which is then used to adjust a signal in the loop filter. The particular implementation of the loop filter can determine the appropriate analog or digital implementation to utilize to provide the DC offset.

Figure 12:
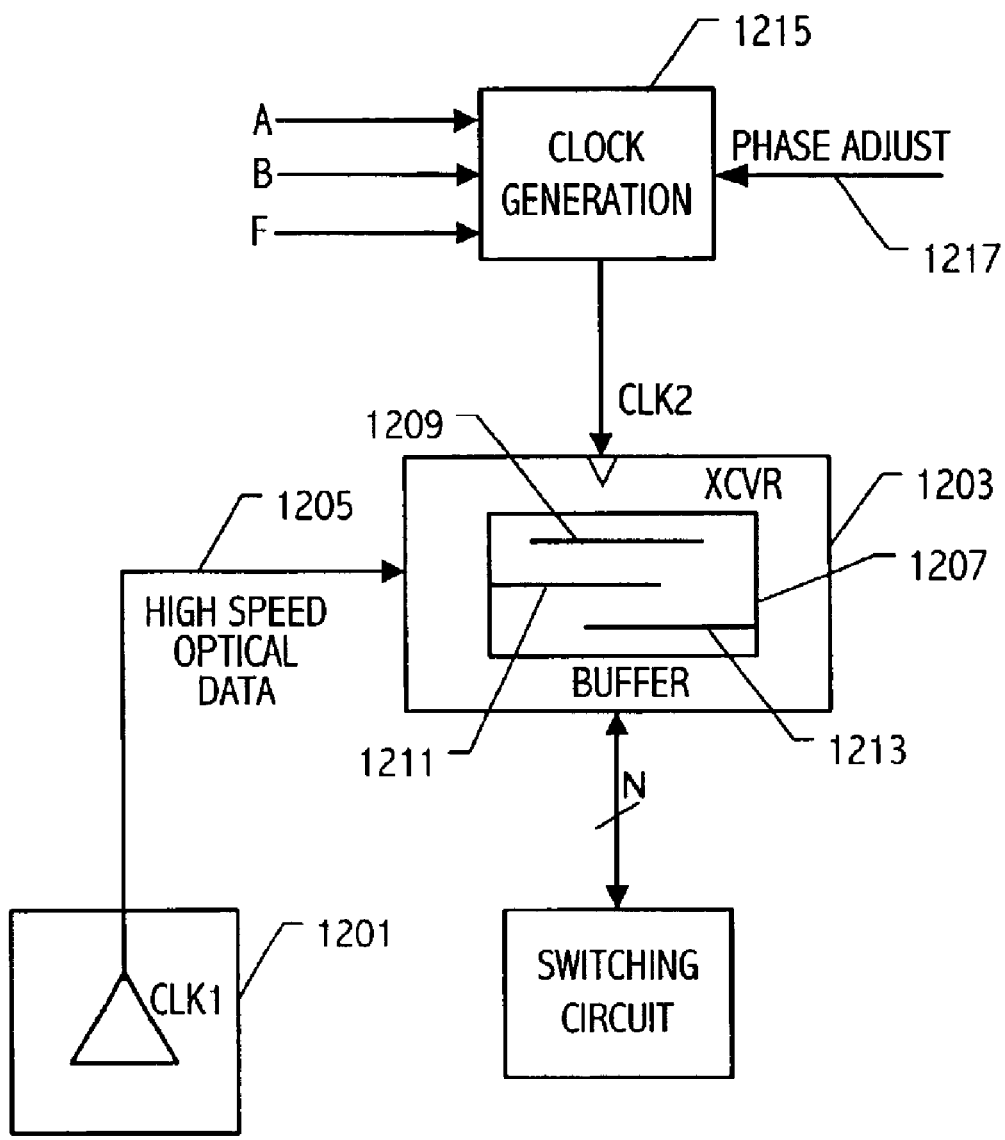
FIG. 12 illustrates an exemplary portion of a SONET or SDH system.

Each time there is a switch to a different input clock, the resulting change in phase is limited to a small phase change, e.g.,+/−200 picoseconds according to the accuracy of the phase offset estimation. Although that is a relatively small phase hit, multiple switches between input clocks can accumulate and cause the output clock to wander too far from its ideal phase. Referring to FIG. 12, an exemplary SONET or SDH based system is illustrated. The high speed optical data is transmitted from a source 1201 to a destination 1203 over an optical link 1205. The source and destination may be kilometers away from each other. The destination includes a buffer 1207. The transmitted data is being clocked at source 1201 by the clock CLK1 and is being received and read out of buffer 1207 utilizing a clock CLK2. CLK1 and CLK2 can lose synchronization from, e.g., accumulated phase hits (changes in output phase caused by, e.g., switching clocks), causing the utilization of buffer 1207 to change from a desired centered position 1209 in which data is stored into the buffer and read out of the buffer at approximately the same rate, to a leading position 1211 or a lagging position 1213 in which data in the buffer is being stored into and retrieved at sufficiently different rates to cause the buffer utilization to be changed from its desired centered position. Adjusting the phase of, e.g., CLK2, by using an externally supplied phase adjust request 1217 to the clock generation chip 1215 can resynchronize the clocks and recenter the buffer.

Thus, making phase adjustments programmable as well as automatic (in a hitless switching context) adds additional capability to successful operation of a communication system. The programmable phase adjust mode allows the output clock phase to be changed in discrete steps and configured to an arbitrary phase. That can be used to make up for cumulative phase hits due to multiple switches or simply to set a desired output phase. The newly adjusted output clock phase will then be held as long as the chip continues to lock to the same input clock.

Figure 13:
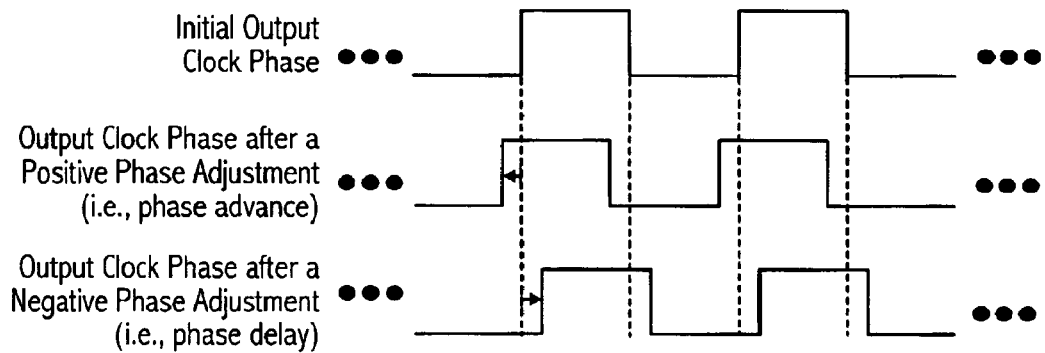
FIG. 13 illustrates phase adjustment.

FIG. 13 illustrates the manner in which phase adjustments are described herein. Positive phase adjustments (i.e., phase advances) cause the output clock transitions to occur sooner than they would if no phase adjustment was made. Negative phase adjustments (i.e. phase delays) cause the output clock transitions to occur later than they would if no phase adjustment was made.

In one embodiment, three mode select input terminals Mode Select [2:0] (not shown) are provided on clock generation chip 1215 to specify whether or not the integrated circuit is operating in a programmable output phase adjust mode in which the phase of the output clocks can be programmably adjusted. In that embodiment, output phase adjust mode may be entered by setting the Mode Select[0] input terminal high while keeping the Mode Select[2:1] pins low. Switching from normal mode to output phase adjust mode (or vice-versa) preferably does not interfere with any core functionality and does not cause any change in the output clocks.

In one implementation in which programmable output phase adjust capability is provided, a serial port is used to communicate phase adjust information from a source external to the integrated circuit. Referring again to FIG. 7, that serial port may include, e.g., a serial clock 721 and serial data input 723 that can be used to serially program phase adjust registers. A parallel load control 725 can be used as a control input used to transfer the values serially programmed into phase adjust registers 727 into phase adjusting circuitry such as phase adjust logic 707 and DAC 511 (see FIG. 7). In response to assertion of the parallel load control input 725, the phase adjust logic 707 supplies inputs to DAC 511 to generate an offset signal based on the programming of the phase adjust registers 727. That forces the output of the PLL to be adjusted by the programmable offset amount. In addition, output phase can be adjusted for coarse adjustments using the spit/swallow logic. In one embodiment, output phase adjust requests come in the form of one or more pulses on an input terminal, with one or more pulses corresponding to a specified phase adjustment amount. Note that while the same circuitry may be used to provide both hitless switching capability and programmable output phase adjust mode, the circuitry may also be implemented separately.

In one embodiment, output phase adjust mode provides capability for both coarse and fine phase adjustments. In one such embodiment coarse phase adjustment provides phase increments of $+/-T_{IN}/16$ where $T_{IN}=1/f_{IN}$ ($f_{IN}$ is the frequency of the input clock to which the device is locked). For a 19.44 MHz input clock, $T_{IN}/16$ is 3.215 ns. Fine phase adjustment enables phase increments in LSB steps of $+/-T_{IN}/512$. For a 19.44 MHz input clock, this corresponds to LSB steps of 100.5 ps. For many applications, coarse phase adjustments are sufficient.

In one embodiment, the phase adjust register 727 is a 27-bit register that is serially programmed. The register is defined as follows:

TABLE 1

| Bits | Name | Internal Function |
| --- | --- | --- |
| [0] | coarseDelayF | If input F is active, adjusts phase $- T_{IN}/16$ |
| [1] | coarseAdvanceF | If input F is active, adjusts phase $+ T_{IN}/16$ |
| [8:2] steps | finePhaseF[6:0] | If input F is active, allows $+/- T_{IN}/512$ phase |
| [9] | coarseDelayB | If input B is active, adjusts phase $- T_{IN}/16$ |
| [10] | coarseAdvanceB | If input B is active, adjusts phase $+ T_{IN}/16$ |
| [17:11] steps | finePhaseB[6:0] | If input B is active, allows $+/- T_{IN}/512$ phase |
| [18] | coarseDelayA | If input A is active, adjusts phase $- T_{IN}/16$ |
| [19] | coarseAdvanceA | If input A is active, adjusts phase $+ T_{IN}/16$ |
| [26:20] steps | finePhaseA[6:0] | If input A is active, allows $+/- T_{IN}/512$ phase |

Note that in the embodiment of the phase adjust registers illustrated in Table 1, three clocks, A, B, and F, are assumed to be available for phase adjustment. Those clocks correspond to the clocks shown, e.g., in FIG. 8 and described further with respect to FIG. 15.

Figure 14:
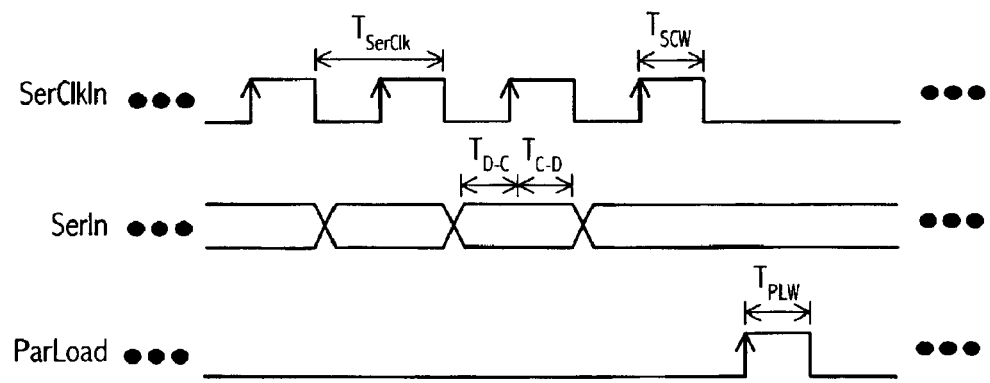
FIG. 14 illustrates timing associated with an embodiment of a serial port.

In one embodiment, the phase adjust register chain is filled from the serial data in terminal 723 to register [0] through the chain to register [26]. Thus, the entire chain can be programmed with 27 rising edges on clock 721. In one embodiment, any additional rising edges on clock 721 will cause serial data to "fall off the edge" at the finePhaseA[26] register. A rising edge on the load signal 725 then transfers the programmed register values into the internal phase adjusting circuitry to adjust the output clock phase. FIG. 14 illustrates exemplary timing for one embodiment of programming output phase adjust mode. In one embodiment, the frequency of the serial clock may be less than 1.5 MHz, the time from data to clock ($T_{D-C}$) and from clock to data ($T_{C-D}$) are >300 ns, and the serial clock pulse width ($T_{SCW}$), and the parallel load pulse width ($T_{PLW}$) are >300 ns.

A coarse phase adjustment is made by simply programming either the appropriate coarseAdvanceX bit or the appropriate coarseDelayX bit high (where X=A, B, or F according to the currently selected input clock). Applying a rising edge to the load signal 725 then causes the output clock phase to move by $+/-T_{IN}/16$. That phase change may be accomplished by utilizing a spit/swallow adjustment as described previously to adjust the phase of the feedback signal by, e.g., a period of the high: speed clock. The difference between the PLL output and the feedback signal will be detected by the phase detector and the PLL will adjust its output as specified to compensate for the spit or swallowed pulse. Additional phase adjustments of $+/-T_{IN}/16$ can then be triggered by simply applying additional rising edges on load signal 725. There is no need to re-program the registers. In one embodiment, if both the coarseAdvanceX and the coarseDelayX registers for a given input clock are programmed high or both are programmed low, the output clock phase will not change in response to rising edges on load signal 725. Coarse phase adjustments may be implemented using the variable divider block 420 (see FIG. 7) and causing a spit or swallow to occur based on whether the phase adjustment is to be positive or negative. That in turn causes the phase/frequency detector 401 to detect a phase difference, output an error signal that is provided to the loop filter (LF), which causes the VCO to adjust its output until the PLL is once again locked, i.e., the error term provided to the loop filter is zero.

In one embodiment fine phase adjustments are made by adjusting a DC offset provided, e.g., by a DAC 511 in FIG. 7. The DAC injects an offset signal which is provided as a phase error to the loop filter. That in turns causes the VCO to adjust its output which results in a phase difference between the feedback signal and the reference clock. The phase detector detects that phase difference and outputs a phase error signal that compensates for the injected offset, eventually resulting in the error signal being provided to the loop filter being zero.

In one embodiment, the DAC utilizes a seven bit digital value and has a centered digital value of 1000000 (64). In one embodiment the supplied programmed value from the finePhaseX[6:0] register is utilized to increment or decrement the present digital value being supplied to the DAC by the amount specified in bits [6:0]. For example, if the digital value currently being supplied to the DAC is 1000100 ($+4T_{IN}/512$ from center) and the offset specified in finePhaseX[6:0] is 00000011 ($+3T_{IN}/512$ from center), the digital value supplied to the DAC becomes 10000111 ($+7T_{IN}/512$ from center). In various embodiments, the finePhaseX[6:0] bits may be provided as signed numbers, as 2's complement numbers, or numbers representing an offset from a center value as described further herein.

In another embodiment, the value specified by the bits in finePhaseX[6:0] is the value supplied to the DAC. Thus it may be preferable to have knowledge of the current value being utilized by the DAC before fame adjustments can be made. In such an embodiment, the fine adjustments are made by specifying the amount of absolute offset desired rather than the offset desired relative to the current offset value being utilized by the phase adjust logic/DAC generating the offset. When the current value being utilized by the DAC is known, fine phase adjustments can also be made by programming the finePhaseX[6:0] register to a binary value equal to the internal state of the code plus the desired phase offset. For example, if the current offset being utilized is 1001101 and a phase adjustment of $-7\,T_{IN}/512$ (i.e. 7 LSBs) was desired, the finePhaseX[6:0] register should be programmed to 1001101−0000111=1000110. In one embodiment, the seven-bit binary code, finePhaseX[6:0], represents a total of $T_{IN}/4$ of phase, or $T_{IN}/512$ per LSB step. Coarse and fine phase adjustments can be combined to produce arbitrary phase adjustments with resolution of one LSB.

For the phase adjust register shown in Table 1, the following provides some examples of utilizing the phase adjust registers. First set the input terminals Mode Select [2:0] =001 to enter the output phase adjust mode. In order to program the phase adjust registers to centered values of 1000000 each, the 26 bit phase adjust register should be programmed as:

[26:0]=1000000_0_0_1000000_0_01000000_0_0.

Applying a single rising edge to the load signal 725 causes the phase adjust registers to load into the corresponding phase adjust logic associated with each input clock (A, B, and F) and sets the digital value utilized by the DACs at 64, which is the centered value (i.e. 0 offset).

For coarse positive phase adjustments, program the phase adjust registers as follows:

[26:0]=1000000_1_0_1 000000_1 _0_1 000000_1_0

For negative phase adjustments, program the phase adjust registers as follows:

[26:00]=1000000_0_1_1000000_0_1_1000000_0_1

For fine phase adjustments, the finePhaseA/B/F[6:0] registers should be programmed to the appropriate binary code relative to the centered code of 1000000. Note that coarse and fine phase adjustments can be superimposed by programming both the coarse and fine registers appropriately. If the selected input clock is known, only the corresponding set of phase adjust registers need to be programed. However, all three sets of phase adjust registers may also be programmed in an identical way as shown herein.

Apply a rising edge to the load signal 725 causes the phase adjust logic/DAC logic to adjust the output phase according to the programmed values. If the registers have been programmed for coarse phase adjustments (with or without fine phase adjustments), additional coarse phase adjustments of +/−$T_{IN}$/16 can be triggered by simply applying more rising edges to ParLoad. One may return to normal mode by setting mode Select[2:0]=000.

In one embodiment, under normal operating conditions, the digital values used by the DAC range from 0100000 to 1100000. If this is the case and if one is utilizing an embodiment in which the current offset values being utilized by phase adjust logic 707 and DAC 511 are unknown, programming a phase adjust can cause an unpredictable output clock phase shift of up to +/−$T_{IN}$/16. For example, assume the PLL was locked to input clock B and the value being utilized by the DAC was 0100000. Then centering the DAC 511 at 1000000 would cause the output clock phase to shift by +$T_{IN}$16. Alternatively, if the internal state of the DAC was 1011101, then centering the DAC would cause the output clock phase to shift by −29 $T_{IN}$/512.

Note that if hitless switching is being utilized and the PLL switches to a different input clock, the next phase adjustment (i.e. the next rising edge on ParLoad) will again be unpredictable. That is because the digital values being utilized by the DAC 511 for the unselected input clocks are constantly changing as part of the hitless switching. Thus, even for embodiments where the current values are readable, the lag between reading them and being able to adjust them allows the DAC to change, thus rendering the actual DAC value unknown at the time the phase is adjusted. Accordingly, it may be preferable to provide a value to adjust the current offset rather than specify absolutely the offset.

The following examples assume that finePhaseA/B/F[6:0] registers need to be programmed to the appropriate binary code relative to the centered code of 1000000. Assume that $f_{IN}$ is 19.44 MHz ($T_{IN}$/512=100.47 ps) and that the goal is to change the output phase by +197$T_{IN}$/512=19.3906 ns. First, we set Mode Select[2:0]=001 to go into output phase adjust mode. The phase registers are then programmed as follows:

[26:0]=1000000_00_1000000_0_0_10000000_0

Applying a single rising edge to the load signal 725 causes the values in the phase adjust registers to be loaded into the phase adjust logic 701 and applied to the DAC and the DAC is centered at 1000000. Assume the device is locked to input clock B and that the DAC 511 is currently utilizing an offset of 1011000. This step changes the external phase by −24$T_{IN}$/512 (the centered value being 24 less than the previous offset), which equals −2.4113 ns. In order to meet the original phase adjust goal, the phase needs to be advanced by 197 $T_{IN}$/512−(−24TIN/512)=221 $T_{IN}$/512=22.2037 ns to achieve the original phase adjust goal. This equals 6* TIN /16 +29 $T_{IN}$/512. So, program the phase adjust registers for coarse phase advances and for 29 LSBs worth of fine phase advances as shown below (where the x's represent "don't cares"). Note that use of "don't cares" may not always be shown herein.

[26:0]=xxxxxxx_x_x_1011101_1_0_xxxxxxx_x_x

Next apply six consecutive rising edges to the load signal 725. The first rising edge advances the phase $T_{IN}$/16+29 $T_{IN}$/512=6.1286 ns. The other five rising edges each advance the phase an additional $T_{IN}$/16=3.2150 ns.

As another example, assume that $f_{IN}$ is 19.44 MHz ($T_{IN}$/512=100.47 ps) and that the goal is to change the output phase by −89$T_{IN}$/512=−8.9418.ns. First set Mode Select [2:01]=001 to go into output phase adjust mode. Note that in some embodiments, that may be unnecessary. Writing a value into the phase adjust registers utilizing the serial bus may be all that is needed. The phase adjust registers are then programmed as follows:

[26:0]=1100000_0_0_1000000_0_0_1000000_0_0

A rising edge is applied to the load signal 725 to load the phase adjust registers into the phase adjust logic 707 to change the digital value being supplied to the DAC. Assume the device is locked to input clock F and that the DAC 51 1 was using 1011110. Thus, this step changes the external phase by −30$T_{IN}$/512=−3.0141 ns. It is now necessary to advance the phase by −89 $T_{IN}$/512−(−30 $T_{IN}$/512=−59 $T_{IN}$/512=−5.9277 ns to achieve the original phase adjust goal. This is also equal to −$T_{IN}$/16+(−27 $T_{IN}$/512). So, one can program the phase adjust registers in either of two ways as follows:

[26:0]=xxxxxx_x_x_xxxxxxx_x_x_00001101_0_0 or

[26:0]=xxxxxx_x_x_xxxxxxx_x_x_01001101_0_1

Then apply one rising edge to the load signal 725. If the registers were programmed according to the first sequence shown above, the output clock phase will change by −59$T_{IN}$/512=−5.9277 ns (fine phase adjustments only). If the registers were programmed according to the second sequence shown above, the output clock phase will change by −$T_{IN}$/16+(−27 $T_{IN}$/512) =−5.9277 ns (combined coarse and fine phase adjustments). Either way, the same phase change occurs at the device's clock outputs.

Although, the description of output phase adjust has generally assumed that hitless switching circuitry is being utilized to achieve the programmable phase adjust, separate circuitry may be utilized. In fact, output phase adjust capability may be provided where switching of clocks is not utilized. Further, while programmable output phase adjust mode has generally been described with respect to a DAC, in certain embodiments, such as that shown in FIG. 10A, where the delay block may be digitally controlled, the conversion to an analog signal is unnecessary.

Figure 15:
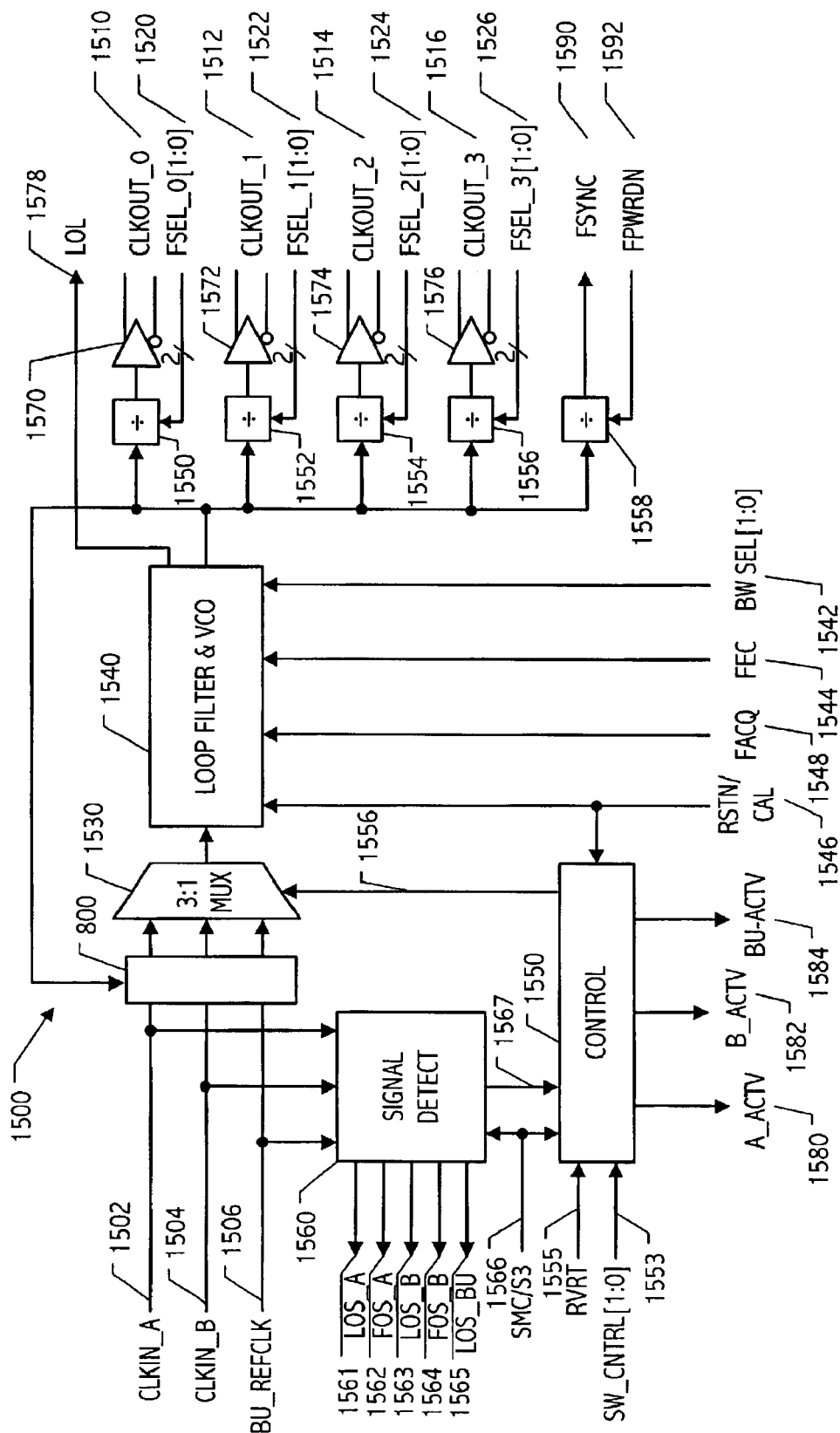
FIG. 15 illustrates an exemplary integrated circuit suitable for incorporating one or more of the embodiments described herein.

One exemplary application of the hitless switching approach described herein is provided in FIG. 15. As shown in FIG. 15, a high speed clock generation integrated circuit 1500 is shown suitable for use with line cards compliant with the SONET or SDH standard. The inventions described herein need not be limited in use to the application of FIG. 15, other SONET applications or SDH applications, and other applications, such as for example other clock generation applications, may also utilize the inventions described herein as will be recognized by those skilled in the art.

In one embodiment as illustrated in FIG. 15, three independent 19.44 MHz system clocks 1502, 1504, and 1506 are provided to the clock generation integrated circuit 1500 as shown (though described with respect to three system clocks, other numbers of system clocks may alternatively be utilized). Two system input clocks, clock 1502 (CLKIN_A) and clock 1504 (CLKIN_B) are provided so that the clock generation integrated circuit 1500 may generate SONET/SDH compliant clock outputs. System input clock 1506 (BU_REFCLK) maybe optionally used to determine frequency offset errors between the input clocks or be used as an additional input clock for the phase locked loop circuitry as described in more detail below. The clock generation integrated circuit 1500 operates to attenuate jitter at user selectable loop bandwidths, and output multiple clean clocks to the SONET/SDH line card. The multiple clean clocks are provided based upon a phase-locked clock multiplier arrangement. Four clock outputs 1510, 1512, 1514 and 1516 are provided as CLKOUT_0, CLKOUT_I CLKOUT_2, and CLKOUT_3, respectively. Each clock output may be set to independently produce 19.44 MHz, 155.52 MHz or 622.08 MHz outputs (or 15/14 forward error correction (FEC) versions of the clocks). The frequency of each output clock may be set based upon a two bit frequency select signal provided for each clock at frequency select input pins of the integrated circuit 1500. Thus, two input pins are provided to accept the frequency select signal 1520 (FSEL0) to control clock output 1510, two input pins are provided to accept the frequency select signal 1522 (FSEL_1) to control clock output 1512, two input pins are provided to accept the frequency select signal 1524 (FSEL_2) to control clock output 1514, and two input pins are provided to accept the frequency select signal 1526 (FSEL_3) to control clock output 1516. Based upon the two frequency select bits provided to each clock, each clock may be set to a clock driver power down mode, a 19.44 MHz output mode, a 155.52 MHz output mode or 622.08 MHz output mode. The output clocks may be presented with less than 1 psycs jitter.

As shown in FIG. 15, each of the input clocks 1502, 1504, and 1506 are provided to input block 800 (shown in FIG. 8 and described above) containing unique logic blocks 807, 809, and 811 for each of the clock inputs. Note that some feedback and control signals shown and described previously are not illustrated in FIG. 15 to simplify the presentation. The outputs of block 800 are provided to multiplexer 1530. One of the outputs from block 800 is selected by multiplexer 1530 as the input to loop filter and VCO circuit 1540, as described previously herein. A phase-locked loop is formed by input block 800, multiplexer 1530 and loop filter and VCO 1540 that multiplies one of the input clock signals and provides output clock signals. Multi-rate operation may be achieved by configuring the device to divide down the output of the PLL voltage controlled oscillator (VCO) to the desired clock rate. Thus, the output of the loop filter and VCO circuit 1540 is provided to clock divider circuits 1550, 1552, 1554, and 1556 which respond to the frequency selection signals 1520, 1522, 1524, and 1526 respectively to provide the appropriate divisor factor to obtain the desired output clock frequencies. Clock output drivers 1570, 1572, 1574, and 1576 may be current mode logic (CML) drivers for providing the high frequency differential clock outputs.

As will be described in more detail below, the phase locked loop circuit may be formed utilizing digital signal processing components. The use of digital signal processing (DSP) components in the PLL provides advantages as compared to many traditional analog PLL circuits including lowering jitter and noise and eliminating the need for external loop filter components found in traditional PLL implementations. The digital signal processing components may include the use of a DSP algorithm to replace the loop filter commonly found in analog PLL designs as described in patent application Ser. No. 09/902,541, filed Jul. 10, 2001, entitled DIGITALLY-SYNTHESIZED LOOP FILTER CIRCUIT PARTICULARLY USEFUL FOR A PHASE LOCKED LOOP, by Michael H. Perrott et al. This algorithm processes the phase detector error term and generates a digital control value to adjust the frequency of the PLL's voltage controlled oscillator (VCO). Aspects of generating a control value for the VCO are described in detail in the provisional Application No. 60/360,333, filed Feb. 28, 2002 entitled, DIGITAL EXPANDER APPARATUS AND METHOD FOR GENERATING MULTIPLE ANALOG CONTROL SIGNALS PARTICULARLY USEFUL FOR CONTROLLING A SUB-VARACTOR ARRAY OF A VOLTAGE CONTROLLED OSCILLATOR, naming Yunteng Huang and Bruno Garlepp as inventors, which is incorporated herein by reference, and in Application No. 10/188,576 entitled DIGITAL EXPANDER APPARATUS AND METHOD FOR GENERATING MULTIPLE ANALOG CONTROL SIGNALS PARTICULARLY USEFUL FOR CONTROLLING A SUB-VARACTOR ARRAY OF A VOLTAGE CONTROLLED OSCILLATOR, namning Yunteng Huang and Bruno Garlepp as inventors, filed the same day as the present application and which is incorporated by reference. Because external loop filter components are not required, sensitive noise entry points are eliminated thus making the PLL less susceptible to board-level noise sources. In addition, since the PLL technology includes digital components, the user may control the loop parameters without the need to change components. A two pin loop bandwidth selection input 1542 (BWSEL) is provided to the PLL 1540 so that a user ray select one of three loop bandwidth settings (3200 Hz, 800 Hz, or 6400 Hz) for different system requirements. Lower bandwidth selection settings may result in more jitter attenuation of the incoming clock but may result in higher jitter generation. A forward error correction (FEC) pin 1544 may also be provided to enable an FEC mode by scaling the output of the PLL by a factor of 15/14 or 14/15.

All output phase adjustments in output phase adjustment mode meet the SONET MTIE mask requirements for phase hits, regardless of PLL bandwidth selection. However, the bandwidth selection determines the maximum instantaneous output frequency shift resulting from output phase adjustments. Table 2 below shows the instantaneous output frequency shifts due to fine and coarse output phase adjustments available in an embodiment providing programmable output phase adjust capability for each of three bandwidth settings. The table assumes the device is locked to a 19.44 MHz input clock signal.

TABLE 2

| Selected Bandwidth | Phase Adjust Resolution | Maximum Instantaneous Output Frequency Shift due to an Output Phase Adjustment |
|---|---|---|
| 6400 Hz | Fine: 100.5 ps | 4.04 ppm |
|  | Coarse: 3.215 ns | 130 ppm |
| 800 Hz | Fine: 100.5 ps | 505 ppb |
|  | Coarse: 3.215 ns | 16.2 ppm |
| 100 Hz | Fine: 100.5 ps | 63.1 ppb |
|  | Coarse: 3.215 ns | 2.02 ppm |

Also coupled to the PLL portion 1540 are a reset/calibration input 1546 (RSTN/CAL) and a force frequency acquisition input 1548. The reset/calibration input 1546 resets the device and places the outputs in a high impedance state. When the reset/calibration input is driven asserted, the internal circuitry goes into a reset mode and all TTL outputs are put into a high impedance state. The positive and negative terminals of the output drivers 1570, 1572, 1574, and 1576 are each tied to a VDD voltage reference through 100 ohm on-chip resistors. That feature is useful for use in in-circuit test applications. When the reset/calibration input is deasserted, digital logic is placed in a known initial condition, the PLL calibrates and begins to lock to the incoming clock and the outputs become active. In one embodiment a force frequency acquisition input 1548 is provided to force a PLL recalibration and the PLL will reacquire lock to the incoming clock.

As mentioned above, one of the input clocks 1502, 1504 and 1506 maybe selected as the PLL input clock in the manner described above and used to generate the output clock. The selection of which input clock is utilized may be an automatic selection or may be a manual selection. When in an automatic mode, the switching of inputs may be automatically accomplished based upon predetermined parameters. As described below, the automatic criteria may be revertive (return to the original or default clock when an alarm condition clears) or non-revertive. When in manual mode, the device will select the clock specified by the value of the input clock select pins. As described below, glitch free transition from one input clock to another, as per Stratum 3, 3E, or SMC/S3 clock requirements, may be provided utilizing the techniques disclosed herein.

The switching mode may be set by the two bit switching control signal 1553 (SW_CNTRL) which may be provided from a user at two pins of the clock generation integrated circuit 1500. The switching control signal 1553 is provided to a control block 1550. The control block 1550 generates a multiplexer control signal 1556 which is coupled to the multiplexer 1530. The multiplexer control signal 1556 controls the multiplexer to provide the appropriate difference signal to the PLL portion 1540 according to the determination of the control block 1550. The digital states of the two bits of the switching control signal 1553 may designate either manual selection of clock 1502 (CLKIN_A), clock 1504 (CLKIN_B), clock 1506 (BU_REFCLK), or automatic reference clock selection mode. When the switching control signal 1553 is set to manually select an input reference, the loop filter and VCO 1540 receive the selected input clock difference signal and will lock to that clock. In another embodiment, a separate pin may be provided to select whether the automatic reference clock selection should be utilized and one value of the two input bits 1553 may specify a digital hold mode.

In the automatic switching mode, switching between clocks may be determined by predetermined parameters. For example, switching may be based upon certain undesirable events such as a loss of signal (LOS) or excess frequency offset (FOS). Signal detection circuitry 1560 may be provided to monitor the input clocks 1502, 1504, and 1506 to determine if LOS or FOS events have occurred.

For example, an LOS event will be designated if a missing pulse is detected on one of the input clocks. The occurrence of an LOS event for each clock will be indicated on an output of the clock generation integrated circuit. For example, an LOS event for clock 1502 (CLKIN_A), clock 1504 (CLKIN_B), clock 1506 (BU_REFCLK) will be indicated as an alarm state at outputs 1561 (LOS_A), 1563 (LOS_B), 1565 (LOS_BU) respectively. When the LOS state ceases for some predetermined time, the LOS clock alarm will be cleared. For example, in one embodiment a user may designate either 100 ms or 13 seconds of a valid clock signal to trigger removal of the LOS alarm.

An FOS event will be designated when the frequency offset between the reference/backup clock 1506 (BU_RFFCLK) and one of the two clocks 1502 (CLKIN_A) and 1504 (CLKIN_B) exceeds a user selected offset threshold. Output 1562 (FOS_A) indicates that the frequency offset between clock 1506 (BU_REFCLK) and clock 1502 (CLKIN$_A$) has exceeded the selected offset threshold and output 1564 (FOS_B) indicates that the frequency offset between clock 1506 (BU_REFCLK) and clock 1504 (CLKIN_B) has exceeded the selected offset threshold. The LOS and FOS states are also provided from the signal detection circuitry 1560 to the control block 1550 via control signal lines 1567.

In addition to receiving the control signal lines 1567, the switching control signal 1553 (SW_CNTRL) and the reset/calibration input 1546 (RSTN/CAL), the control block 1550 also receives reverting switching input selection signal 1555 (RVRT) from an input pin of the clock generation integrated circuit 1500. In the automatic switching mode, the automatic switching can be either revertive (return to the original or default input after alarm conditions clear) or non-revertive (remain with selected input until an alarm condition exists on the selected input) depending upon the user selected state of the reverting switching input selection signal 1555 (RVRT).

When in the automatic switching mode (as designated by the switching control signal 1553), the switching between clocks will be controlled by multiplexer control signal 1556 that is provided by the control block 1550 in response to the control signal line 1567, the reset/calibration input 1546 (RSTN/CAL), and the reverting switching input selection signal 1555 (RVRT). In the automatic mode, the input clock selected to be provided to the PLL 1540 may default to clock 1502 (CLKIN_A) when a power-up, reset, or revertive mode with no alarms present occurs. If an LOS or FOS alarm occurs on clock 1502 (CLKIN_A), the device will switch to clock 1504 (CLKIN_B) if there are no active alarms for clock 1504 (CLKIN_B). If both clock 1502 (CLKIN_A) and clock 1504 (CLKIN_B) are alarmed, the device will switch to clock 1506 (BU_REFCLK), if clock 1506 (BU_REFCLK) is supplied and alarm free. If no clock 1506 (BU_REFCLK) is provided and both clock 1502 (CLKIN$_A$) and clock 1504 (CLKIN_B) are alarmed, the internal oscillator of the PLL 1540 may be digitally held to its last frequency value. This will provide a stable clock to the system until an input clock is again valid. This clock will maintain very stable operation in the presence of constant voltage and temperature. If voltage and temperature vary, the output clock rates will also vary.

As mentioned above, in the automatic protection switching mode automatic switching can be revertive or non-revertive. In revertive mode when an alarm which caused a switch of the input reference clock clears, the multiplexer 1530 will switch back to the default input clock. In non-revertive mode, the multiplexer 1530 will switch to the highest priority non-alarmed input when an alarm occurs on the currently selected input. The priority for inputs is first clock 1502 (CLKIN_A), then clock 1504 (CLKIN_B), then clock 1506 (BU_REFCLK), and then the digital hold mode, if available.

In this manner, the control block 1550 may automatically control which clock drives the PLL via the multiplexer 1530. The control block 1550 may provide the automatic switching in response to user selected parameters and internally detected clock signal conditions. It will be recognized that the user selected parameters, the detected signal conditions, the default clock settings, the clock priorities, etc. described above are merely exemplary and other parameters, conditions, settings, priorities may be utilized while still achieving automatic switching.

As mentioned above, frequency offset (FOS) is monitored with the signal detection circuitry 1560 and compared to a predetermined maximum offset standard. Thus, the signal detection circuitry 1560 indicates whether the incoming system reference clocks are within the specified frequency offset precision. The limits for the allowable offset may be set with the frequency offset input signal 1566 (SMC/S3) which is provided from a user input pin to the signal detection circuitry 1560 and the control block 1550 as shown in FIG. 1. In one embodiment the frequency offset input signal may be utilized to select one of two offset standards. In this embodiment, the maximum offset may set to one of two industry standards, the SMC/S3 limits of 40–72 ppm or the Stratum3/3E limits of 9.2–16.6 ppm. The value of the frequency offset input signal 1566 (SMC/S3) selects which frequency offset limit is utilized. In operation, the signal detection circuitry 1560 compares the frequency of the clock 1502 (CLKIN_A) and clock 1504 (CLKIN_B) inputs with the frequency of the supplied reference clock 1506 (BU_REFCLK). If the input clock 1502 or 1504 frequency deviates from that of the reference clock by an amount outside of the particular standards limits, a frequency offset alarm is declared for that input clock. If the automatic switching feature is enabled, a switch to an alternate input clock is then initiated. If both the A and B input clocks are in an alarm state the device will lock to the clock 1506 (BU_REFCLK). The FOS alarm signal will be deasserted when the frequency offset is again measured within range. A disable FOS input terminal may be provided to disable operation of the FOS alarm.

The LOS alarm state described above may also override a manual user selection of a specific clock. Thus, if the selected input clock is in a LOS alarm state, the PLL 1540 may be placed into the digital hold mode. If an FOS event is declared for a manually selected clock no effect on operations is provided. However, in an alternative embodiment, an FOS event also places the PLL 1540 in a digital hold mode.

The clock generation integrated circuit 1500 of FIG. 15 includes additional output signals that may be provided to a user at output pins of the clock generation integrated circuit 1500. For example, three active reference signals 1580 (A_ACTV), 1582 (B_ACTV), and 1584 (BU_ACTV) may be provided. In addition a digital hold active signal (DH_ACTV) may be used to indicate that the PLL is in digital hold mode in which the PLL is locked in its current state and outputs clocks with no additional phase and frequency information. The active reference signals 1580, 1582 and 1584 are provided to indicate which input clock (clock 1502 (CLKIN_A) clock 1504 (CLKIN_B), or clock 1506 (BU_REFCLK) respectively) has been selected to be used as the reference signal for the PLL. Thus, the active reference signal that is asserted (for example a high signal) indicates which clock is selected as the clock input for the PLL. A loss of lock output signal 1578 (LOL) may be provided to indicate when the PLL is not frequency locked or is in a calibration mode. A calibration mode active signal (CAL_ACTV) may be provided to indicate self-calibration and an initial lock acquisition period. In addition a frame synchronization clock output 1590 (FYNC) may be provided from a clock divider 1558. The frame synchronization clock output 1590 (FYNC) provides a synchronization clock at nominally 8 kHz based upon a 19.44 MHz input clock. The frame synchronization clock output may be disabled by the user asserting a frame power down signal 1592 (FPWRDN). The signals described above are exemplary. Other input and output signals may be utilized in place of or in addition to the signals described above.

As described above, a plurality of input clocks 1502, 1504, and 1506 may be provided to the high speed clock generation integrated circuit 1500. One of the clock difference signals, indicating the phase difference between an input clock and feedback clocks, along with any injected DC offset to compensate for phase differences between clocks, is selected by multiplexer 1530 and supplied to loop filter and VCO 1540. As further described above, the particular clock utilized as the PLL input clock may be switched depending upon a variety of conditions in a substantially glitch free manner able to meet various switching requirements.

Thus, various embodiments have been described for adjusting the output phase of a clock generated by a PLL. The description of the invention set forth herein is illustrative, and is not intended to limit the scope of the invention as set forth in the following claims. For instance, while some of the described embodiments included digital PLL components, analog implementations of PLLs also can readily exploit the techniques described herein. Other variations and modifications of the embodiments disclosed herein, may be made based on the description set forth herein, without departing from the scope and spirit of the invention as set forth in the following claims.

What is claimed is:

1. A method of adjusting a phase of a clock signal comprising:

generating the clock signal in a phase-locked loop in an integrated circuit;

receiving a phase adjustment request at one or more terminals of the integrated circuit to adjust the phase of the clock signal by a specified amount; and adjusting the phase of the clock signal based on the specified amount; and selectively using one of a plurality of input reference clock signals to generate the clock signal supplied by the phase-locked loop and separately specifying for each input reference clock signal an amount of phase adjustment in the phase adjustment request.

2. The method as recited in claim 1 wherein adjusting the phase comprises injecting an offset based on the specified amount of phase adjustment into the phase-locked loop.

3. The method as recited in claim 2 wherein adjusting the phase includes injecting the offset into a loop filter of the phase-locked loop.

4. The method as recited in claim 1 wherein adjusting the phase based on the specified amount includes adjusting an existing offset amount by the specified amount.

5. The method as recited in claim 4 wherein the existing offset amount is indicative of a stored phase difference between two of the input reference clock signals, each of the input reference clock signals being selectable as the reference clock signal utilized by the phase-locked loop to generate the clock signal.

6. The method as recited in claim 4 wherein adjusting the existing offset amount includes adding or subtracting the specified amount from a digital representation of the existing offset amount.

7. The method as recited in claim 1 wherein the specified amount of phase adjustment is specified as a coarse adjustment, a fine adjustment, or both.

8. A method as recited in claim 1 wherein one bit of the phase adjustment request specifies a fixed amount of positive phase adjustment and another bit specifies the fixed amount of negative phase adjustment.

9. A method of as recited in claim 1 wherein a plurality of bits in the phase adjustment request are used to specify the specified amount.

10. The method as recited in claim 1 wherein receiving phase adjustment request and adjusting the phase further comprises:
receiving a digital sequence having the specified amount; and
causing the phase adjustment to occur in response to assertion of a control signal.

11. The method as recited in claim 1 wherein the phase adjustment request is in the form of a single pulse.

12. A method of adjusting a phase of a clock signal comprising:
generating the clock signal in a phase-locked loop in an integrated circuit;
receiving a phase adjustment request at one or more terminals of the integrated circuit to adjust the phase of the clock signal by a specified amount; and
adjusting the Phase of the clock signal based on the specified amount; and
receiving at least one reference clock signal;
using the phase-locked loop to generate the clock signal using the reference clock signal; and
delaying the reference clock signal according to the specified amount, thereby adjusting the phase of the generated clock signal.

13. A method of adjusting a phase of a clock signal comprising:
generating the clock signal in a phase-locked loop in an integrated circuit;
receiving a phase adjustment request at one or more terminals of the integrated circuit to adjust the phase of the clock signal by a specified amount; and
adjusting the phase of the clock signal based on the specified amount, and
receiving at least one reference clock signal;
using the phase-locked loop to generate the clock signal using the reference clock signal; and
delaying a feedback signal in the phase-locked loop according to the specified amount, thereby adjusting the phase of the generated clock signal.

14. An integrated circuit comprising:
a phase-locked loop (PLL) generating a PLL output signal;
a communication port for receiving a phase adjustment request to adjust a phase of the phase-locked loop output signal; and
a first phase adjustment circuit coupled to the communication port and coupled to the phase-locked loop to adjust the phase based on the phase adjustment request and
wherein the first phase adjustment circuit adds or subtracts a specified phase adjustment amount in the phase adjustment request from an existing offset amount used to adjust the phase of the PLL output signal.

15. The integrated circuit as recited in claim 14 wherein the phase-locked loop is coupled to generate the output signal utilizing a reference clock signal.

16. The integrated circuit as recited in claim 14 wherein the port is a serial port.

17. The integrated circuit as recited in claim 14 wherein the first phase adjustment circuit is coupled to inject an offset into the phase-locked loop, the offset being based on the phase adjustment request.

18. The integrated circuit as recited in claim 14 wherein the first phase adjustment circuit includes a digital to analog converter coupled to the phase-locked loop to inject an analog offset signal into the phase-locked loop based on the phase adjustment request.

19. The integrated circuit as recited in claim 18 wherein the digital to analog converter is coupled with a summing node, the summing node coupled to sum the offset signal with a difference signal that indicates the difference in phase between the first reference clock signal and a feedback signal of the phase-locked loop.

20. An integrated circuit comprising:
a phase-locked loop (PLL) generating a PLL output signal;
a communication port for receiving a phase adjustment request to adjust a phase of the phase-locked loop output signal; and
a first phase adjustment circuit coupled to the communication port and coupled to the phase-locked loop to adjust the phase based on the phase adjustment request; and
wherein the phase adjustment request is a single pulse indicative of a predetermined phase adjustment amount.

21. An integrated circuit comprising:
a phase-locked loop (PLL) generating a PLL output signal;
a communication port for receiving a phase adjustment request to adjust a phase of the phase-locked loop output signal; and
a first phase adjustment circuit coupled to the communication port and coupled to the phase-locked loop to adjust the phase based on the phase adjustment request; and
wherein the first phase adjustment circuit includes a variable divider circuit coupled to divide a feedback signal, the feedback signal being based on the PLL output signal, by an amount dependent upon the phase adjustment request, thereby changing a phase of the feedback signal with relation to a reference clock signal coupled to the PLL and causing the phase of the PLL output signal to adjust.

22. An integrated circuit comprising:
a phase-locked loop (PLL) generating a PLL output signal;
a communication port for receiving a phase adjustment request to adjust a phase of the phase-locked loop output signal; and a first phase adjustment circuit coupled to the communication port and coupled to the phase-locked loop to adjust the phase based on the phase adjustment request; and wherein the phase-locked loop selectively uses one of a first or a second input reference clock signal to generate the PLL output signal, and the integrated circuit further comprises a second phase adjustment circuit coupled to the serial port, to adjust the phase of the PLL output signal when the PLL is utilizing the second input reference clock signal to generate the PLL output signal.

23. An integrated circuit comprising:

a phase-locked loop (PLL) generating a PLL output signal;

a communication port for receiving a phase adjustment request to adjust a phase of the phase-locked loop output signal; and a first phase adjustment circuit coupled to the communication port and coupled to the phase-locked loop to adjust the phase based on the phase adjustment request;

a second phase adjustment circuit coupled to the communication port; and wherein the first phase adjustment circuit includes a variable divider circuit coupled to divide a feedback signal that is based on the phase-locked loop output signal.

24. The integrated circuit as recited in claim 23 wherein the second phase adjustment circuit is coupled to inject an offset into the phase locked loop.

25. The integrated circuit as recited in claim 23 wherein the second phase adjustment circuit includes a delay circuit coupled between the reference clock signal and a phase detector circuit, the delay circuit being coupled to controllably delay the reference clock signal according to the phase adjustment request.

26. An integrated circuit comprising:

a phase-locked loop (PLL) generating a PLL output signal;

a communication port for receiving a phase adjustment request to adjust a phase of the phase-locked loop output signal; and a first phase adjustment circuit coupled to the communication port and coupled to the phase-locked loop to adjust the phase based on the phase adjustment request; and wherein the first phase adjustment circuit includes a delay circuit coupled between a node supplying a reference clock signal and a phase detector circuit, the delay circuit being coupled to controllably delay the reference clock signal according to the phase adjustment request.

27. An integrated circuit comprising:

a phase-locked loop (PLL generating a PLL output signal;

a communication port for receiving a phase adjustment request to adjust a phase of the phase-locked loop output signal; and a first phase adjustment circuit coupled to the communication port and coupled to the phase-locked loop to adjust the phase based on the phase adjustment request; and wherein the first phase adjustment circuit includes a delay circuit coupled in a feedback path of the PLL supplying a feedback signal to a phase detector circuit; the delay circuit being coupled to controllably delay the feedback signal according to the phase adjustment request.

* * * * *

UNITED STATES PATENT AND TRADEMARK OFFICE
CERTIFICATE OF CORRECTION

PATENT NO. : 6,920,622 B1
DATED : July 19, 2005
INVENTOR(S) : Bruno Garlepp et al.

It is certified that error appears in the above-identified patent and that said Letters Patent is hereby corrected as shown below:

Column 21,
Line 38, the word "Phase" should read -- phase --.

Column 24,
Line 21, the words "loop (PLL" should read -- loop (PLL) --.

Signed and Sealed this

Eighteenth Day of October, 2005

JON W. DUDAS
*Director of the United States Patent and Trademark Office*